US006831744B2

(12) United States Patent
Masaki et al.

(10) Patent No.: US 6,831,744 B2
(45) Date of Patent: Dec. 14, 2004

(54) MIRROR DEVICE, MIRROR ADJUSTMENT METHOD, EXPOSURE APPARATUS, EXPOSURE METHOD, AND SEMICONDUCTOR DEVICE MANUFACTURING METHOD

(75) Inventors: Fumitaro Masaki, Tochigi (JP); Akira Miyake, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/389,925

(22) Filed: Mar. 18, 2003

(65) Prior Publication Data

US 2003/0179377 A1 Sep. 25, 2003

(30) Foreign Application Priority Data

Mar. 20, 2002 (JP) ......................................... 2002-078917

(51) Int. Cl.[7] ......................... G01B 11/00; G03B 29/00; G03B 27/42; H01L 21/00; G02B 7/195
(52) U.S. Cl. ........................... 356/400; 355/30; 355/53; 438/7; 438/10; 359/845
(58) Field of Search ................................. 359/196, 197, 359/198, 845, 846, 847, 848, 849; 250/492.2, 548; 355/53, 55, 57, 63, 30, 60; 430/5, 22, 30; 356/399–401; 438/5, 7, 10, 14, 16, 17

(56) References Cited

U.S. PATENT DOCUMENTS

| 5,222,112 | A | | 6/1993 | Terasawa et al. ............. 378/34 |
|---|---|---|---|---|
| 5,390,228 | A | | 2/1995 | Niibe et al. .................... 378/34 |
| 5,394,451 | A | | 2/1995 | Miyake et al. ................ 378/34 |
| 5,444,758 | A | | 8/1995 | Miyake et al. ............... 378/113 |
| 5,448,612 | A | * | 9/1995 | Kasumi et al. ................ 378/84 |
| 5,606,586 | A | | 2/1997 | Amemiya et al. ............. 378/34 |
| 5,896,438 | A | | 4/1999 | Miyake et al. ................ 378/34 |
| 6,038,279 | A | | 3/2000 | Miyake et al. ................ 378/34 |
| 6,054,713 | A | | 4/2000 | Miyake et al. .......... 250/492.24 |
| 6,504,896 | B2 | | 1/2003 | Miyake et al. ................ 378/34 |
| 6,549,270 | B1 | * | 4/2003 | Ota .............................. 355/55 |
| 2001/0055102 | A1 | * | 12/2001 | Emoto .......................... 355/53 |
| 2003/0020890 | A1 | | 1/2003 | Ogushi et al. ................ 355/53 |
| 2003/0169520 | A1 | * | 9/2003 | Goldstein .................... 359/845 |
| 2003/0235682 | A1 | * | 12/2003 | Sogard .................... 428/195.1 |

FOREIGN PATENT DOCUMENTS

| EP | 0 987 601 A2 | 3/2000 |
|---|---|---|
| JP | 10-284390 | 10/1998 |
| JP | 2002-100551 | 4/2002 |

OTHER PUBLICATIONS

European Search Report dated Aug. 7, 2003, issued in corresponding European patent appln. No. 03 25 1695, forwarded in a Communication dated Aug. 27, 2003.

* cited by examiner

Primary Examiner—Zandra V. Smith
Assistant Examiner—Gordon J. Stock, Jr.
(74) Attorney, Agent, or Firm—Fitzpatrick, Cella, Harper & Scinto

(57) ABSTRACT

A mirror device having an optical system of an exposure apparatus for transferring a reticle pattern onto a wafer includes a mirror, a mirror holding portion, a temperature adjustment unit, a control management database, and a timing control unit. The mirror reflects exposure light, and the mirror holding portion holds the mirror. The temperature adjustment unit adjusts a temperature of the mirror and the mirror holding portion. The control management database stores data corresponding to a controlling rule of the temperature adjustment unit necessary to keep the mirror figure constant for an incidence condition of the reflected exposure light. The timing control unit controls the temperature adjustment unit corresponding to the incidence condition of the exposure light. The timing control unit controls the temperature adjustment unit based on the stored data of the control management database to keep the mirror figure constant.

21 Claims, 18 Drawing Sheets

FIG. 16

```
URL  http://www.maintain.co.jp/db/input.html

TROUBLE DB INPUT WINDOW

OCCURRENCE DATE OF TROUBLE  [2000/3/15]  ~4040
MODEL  [* * * * * * * * *]  ~4010
SUBJECT  [OPERATION ERROR (START-UP ERROR)]  ~4030
DEVICE S/N  [465NS4580001]  ~4020
DEGREE OF URGENCY  [D]  ~4050
SYMPTOM   LED KEEPS FLICKERING AFTER
          POWER ON                           ~4060

REMEDY    POWER ON AGAIN
          (PRESS RED BUTTON IN ACTIVATION)   ~4070

PROGRESS  INTERIM HAS BEEN DONE.             ~4080

[SEND] [RESET]    4100              4110            4120
              LINK TO RESULT LIST DATABASE   SOFTWARE LIBRARY   OPERATION GUIDE
```

SEMICONDUCTOR DEVICE MANUFACTURING FLOW

MIRROR DEVICE, MIRROR ADJUSTMENT METHOD, EXPOSURE APPARATUS, EXPOSURE METHOD, AND SEMICONDUCTOR DEVICE MANUFACTURING METHOD

FIELD OF THE INVENTION

The present invention relates to a mirror device for transferring a fine circuit pattern, a mirror adjustment method, an exposure apparatus, an exposure method, a semiconductor device manufacturing method using the exposure apparatus, and the like.

BACKGROUND OF THE INVENTION

Reduction projection exposure using ultraviolet light has conventionally been performed as a printing (lithography) method of manufacturing a fine semiconductor element such as a semiconductor memory or logic circuit. The minimum size capable of transfer by reduction projection exposure is proportional to the wavelength of light used for transfer and inversely proportional to the numerical aperture of the projection optical system. To transfer a fine circuit pattern, the wavelength of light for use is being shortened. The wavelength of ultraviolet rays for use is becoming shorter to a mercury-vapor lamp i-line (wavelength: 365 nm), a KrF excimer laser beam (wavelength: 248 nm), and an ArF excimer laser beam (wavelength: 193 nm).

However, semiconductor elements rapidly shrink in feature size, and lithography using ultraviolet light reaches its limit in micropatterning of manufacturing a semiconductor element. To efficiently print a very fine circuit pattern with a semiconductor element line width smaller than 0.1 $\mu$m, a reduction projection exposure apparatus using extreme ultraviolet light (to be referred to as "EUV light" hereinafter) whose wavelength is as short as about 10 to 15 nm is being developed.

In the EUV light region, a substance greatly absorbs light. The use of a lens optical system which utilizes light refraction used for visible light or ultraviolet light is not practical. An exposure apparatus using EUV light adopts a reflecting optical system. In this case, a reticle as a master is a reflecting reticle on which a pattern to be transferred is formed by a light absorber.

Reflecting optical elements employed in the exposure apparatus using EUV light include a multilayered mirror and a grazing incidence total reflection mirror. The real part of the refractive index is slightly smaller than 1 in the EUV region, and total reflection occurs in the grazing incidence state in which EUV light is incident almost parallel to the plane. In general, grazing incidence at several degrees from an irradiation plane provides a high reflectance of several ten % or more. However, the degree of freedom in optical design is low, and it is difficult to use the total reflection mirror in the projection optical system.

An EUV light mirror used for an incident angle almost close to normal incidence is a multilayer mirror obtained by alternately stacking two types of substances having different optical constants. Molybdenum and silicon are alternately stacked on the surface of a glass substrate polished into a precise figure. The layer thickness is, e.g., 2 nm for the molybdenum layer and about 5 nm for the silicon layer. The number of stacked layers is about 20 pairs. A value as the sum of the thicknesses of layers of two types of substances will be called a film period. In this example, the film period is the molybdenum layer thickness (2 nm)+silicon layer thickness (5 nm)=film period (7 nm).

When EUV light is incident on the multilayer mirror, EUV light having a specific wavelength is reflected. Letting $\theta$ be the incident angle of EUV light on the multilayer mirror, $\lambda$ be the wavelength of EUV light, and d be the film period, only EUV light with a narrow bandwidth centered on $\lambda$ which approximately satisfies Bragg's equation (1):

$$2 \times d \times \sin\theta = \lambda \quad (1)$$

is efficiently reflected. At this time, the bandwidth is about 0.6 to 1 nm.

The reflectance of reflected EUV light is about 0.7 at maximum. Non-reflected EUV light is absorbed in the multilayer film or substrate, and most of the energy is converted into heat. The multilayer mirror exhibits a large optical loss in comparison with a visible light mirror, and the number of mirrors must be minimized. To realize a wide exposure region with a small number of mirrors, a reticle and wafer are simultaneously scanned (scanning exposure) to transfer a pattern in a large area by using only a narrow arcuate region (ring field) spaced apart from the optical axis by a predetermined distance.

A reduction projection exposure apparatus using EUV light in scanning exposure is mainly constituted by an EUV light source, an illumination optical system, a reflecting reticle, a projection optical system, a reticle stage, a wafer stage, an alignment optical system, and a vacuum system.

As th EUV light source, e.g., a laser plasma source is used. A target material in a vacuum vessel 130 is irradiated with a high-intensity pulse laser beam to generate a high-temperature plasma, and EUV light which is emitted by the plasma and has a wavelength of, e.g., about 13 nm is utilized. The target material is a metal thin film, inter gas, droplets, or the like, and is supplied into the vacuum vessel by means such as a gas jet. To increase the average intensity of emitted EUV light, the repetition frequency of the pulse laser is preferably high. The pulse laser is generally operated at a repetition frequency of several kHz.

The illumination optical system is comprised of a plurality of multilayer mirrors or grazing incidence mirrors, an optical integrator, and the like. A collection mirror on the first stage collects EUV light almost isotropically emitted from a laser plasma. The optical integrator uniformly illuminates a mask at a predetermined numerical aperture. An aperture for limiting a region illuminated on the reticle plane to an arcuate figure is formed at a position conjugate to the reticle of the illumination optical system.

The projection optical system includes a plurality of mirrors. A smaller number of mirrors which constitute the projection optical system provide a higher EUV light utilization efficiency, but make aberration correction difficult. The number of mirrors necessary for aberration correction is about four to six. The reflecting surface of the mirror has a convex or concave spherical or aspherical figure. The numerical aperture NA in this case is about 0.1 to 0.2 (the NA is restricted by a numerical restriction aperture 117 shown by FIGS. 1 and 13). The mirror is fabricated by grinding and polishing a substrate made of a material with a high rigidity, high hardness, and small thermal expansion coefficient, such as low-expansion-coefficient glass or silicon carbide, into a predetermined reflecting surface figure, and forming multilayer films of molybdenum and silicon on the reflecting surface. If the incident angle is not constant depending on the position within the mirror surface, the reflectance of a multilayer film with a constant film period increases depending on the position, shifting the wavelength of EUV light, as is apparent from Bragg's equation. To prevent this, the film period distribution must be set such that EUV light having the same wavelength is efficiently reflected within the mirror surface.

The reticle and wafer stages have systems of scanning these stages in synchronism with each other at a velocity ratio proportional to the reduction magnification. The scanning direction within the reticle or wafer plane is the X-axis, an in-plane direction perpendicular to the scanning direction is the Y-axis, and a direction perpendicular to the reticle or wafer plane is the Z-axis.

A reticle is held by a reticle chuck 116 on the reticle stage. The reticle stage has a driving system of moving the reticle stage along the X-axis at a high speed. The reticle stage also has fine moving systems in the X-axis direction, Y-axis direction, Z-axis direction, and rotational directions around these axes, and can align a reticle. The position and posture of the reticle stage are measured by a laser interferometer, and controlled on the basis of the measurement results.

A wafer is held on the wafer stage by a wafer chuck 120. The wafer stage has a system of moving the wafer stage long the X-axis at a high speed, similar to the reticle stage. The wafer stage also has fine moving systems in the X-axis direction, Y-axis direction, Z-axis direction, and rotational directions around these axes, and can align a wafer. The position and posture of the wafer stage are measured by a laser interferometer, and controlled on the basis of the measurement results.

An alignment detection system 118 measures the positional relationship between the reticle position and the optical axis of the projection optical system, and the positional relationship between the wafer position and the optical axis of the projection optical system. The positions and angles of the reticle and wafer stages are set such that a reticle projection image coincides with a predetermined position on a wafer.

The Z-axis focus position within the wafer plane is measured by a focus position detection system 119, and the position and angle of the wafer stage are controlled. The wafer plane can always keep an imaging position with respect to the projection optical system during exposure.

At the end of one scanning exposure on a wafer, the wafer stage moves step by step in the X and Y directions to the next scanning exposure start position. The reticle and wafer stages are sync-scanned again in the X direction at a velocity ratio proportional to the reduction magnification of the projection optical system. In this way, sync scanning operation is repeated (step & scan) while the reduction projection image of a reticle is formed on a wafer. As a result, the reticle transfer pattern is transferred onto the entire wafer surface.

However, the conventional EUV exposure apparatus suffers from the following problems. As described above, the reflectance of EUV light reflected by the multilayer mirror is about 0.7 at a maximum. Non-reflected light is absorbed in the multilayer film or substrate, and most of the energy is converted into heat. When the mirror or reticle is irradiated with EUV light, non-reflected light is absorbed in an optical element, generating heat.

EUV light as exposure light is strongly absorbed in gas. For example, when EUV light with a wavelength of 13 nm propagates by 1 m through a space filled with air at 10 Pa, about 50% of EUV light is absorbed. To avoid gas absorption, the space through which EUV light propagates must be maintained at a pressure of at least $10^{-1}$ Pa or less, and desirably $10^{-3}$ Pa or less.

If molecules containing carbon such as hydrocarbon remain in a space where an optical element irradiated with EUV light exists, carbon is gradually deposited on the surface of the optical element by light irradiation, and absorbs EUV light, decreasing the reflectance. To prevent carbon deposition, the space where the optical element irradiated with EUV light exists must be maintained at a pressure of at least $10^{-4}$ Pa or less, and desirably $10^{-6}$ Pa or less.

Under this situation, the EUV optical element cannot be cooled by heat conduction to ambient gas, and must be cooled via a mirror holder or reticle chuck which holds the optical element. For this purpose, the mirror and reticle are fixed to the mirror holder and reticle chuck equipped with cooling means of circulating constant-temperature cooling water. Heat generated by absorption of EUV light is externally dissipated from the optical element, suppressing any temperature rise of the optical element.

The optical element is irradiated with EUV light only during exposure. During the remaining time, e.g., while the wafer stage moves to the next scanning exposure start position, or reticles or wafers are replaced, the optical element is not irradiated with light, and no energy absorption occurs. In other words, energy to the optical element is not temporarily constant and greatly varies with time. It is, therefore, difficult to keep the optical element at a constant temperature by a cooling method of, e.g., circulating constant-temperature cooling water through the mirror holder or reticle chuck which holds the optical element without considering any temporary change of the heat amount absorbed by the optical element. The temperature of the optical element becomes different between the start of exposure and the progress of exposure, and the figure of the reflecting surface inevitably changes.

The figure is not always kept unchanged even at a constant temperature on the optical element surface due to the temperature distribution inside the optical element and the temperature difference between upper and lower surfaces. Considering deformation factors such as deflection by weight other than the temperature, the optical element figure, i.e., optical characteristic is not always maintained even at a constant temperature on the optical element surface.

The surface figure of the reflecting surface of the projection optical system must have a very high precision. Letting n be the number of mirrors which constitute the projection optical system, and λ be the wavelength of EUV light, an allowable figure error σ (rms value) is given by Marechal's equation:

$$\sigma = \lambda/(28 \times \sqrt{n}) \qquad (2)$$

For example, for a system having four mirrors and a wavelength of 13 nm, the allowable figure error is σ=0.23 nm.

The temperature rise of an optical element which constitutes the projection optical system causes a surface figure disturbance which exceeds the allowable error. The imaging performance of the projection optical system cannot be fully attained, and the resolution and contrast decrease, failing to transfer a fine pattern.

SUMMARY OF THE INVENTION

The present invention has been made to overcome the conventional drawbacks, and has as its object to provide an exposure apparatus capable of stably transferring a fine pattern without any decrease in resolution or contrast upon a change in reflecting surface figure caused by temperature variations of an optical element, a mirror device suitable for the exposure apparatus, and the like.

More specifically, the present invention provides a mirror device which constitutes an optical system of an exposure apparatus for transferring a reticle pattern onto a wafer, comprising control means for controlling a reflecting surface figure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 16 is a view showing an example of a user interface in the semiconductor device production system including the exposure apparatus according to the embodiment of the present invention;

DETAILED DESCRIPTION OF THE PREFERRED EMBODIMENTS

Preferred embodiments of the present invention will now be described in detail in accordance with the accompanying drawings.

<First Embodiment>

Figure 12:
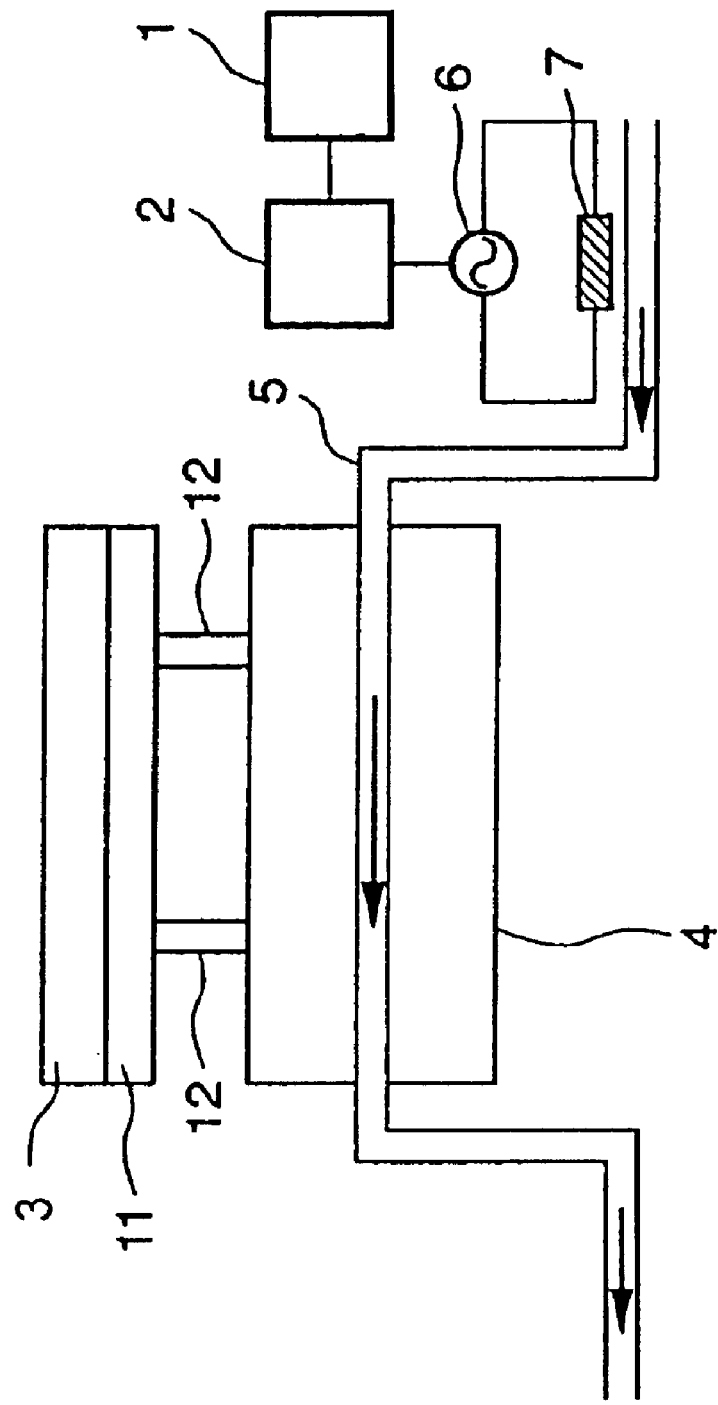
FIG. 12 is a view for explaining an arrangement having a heat pipe in order to reduce vibrations of the mirror cooling portion to the mirror.
Figure 13:
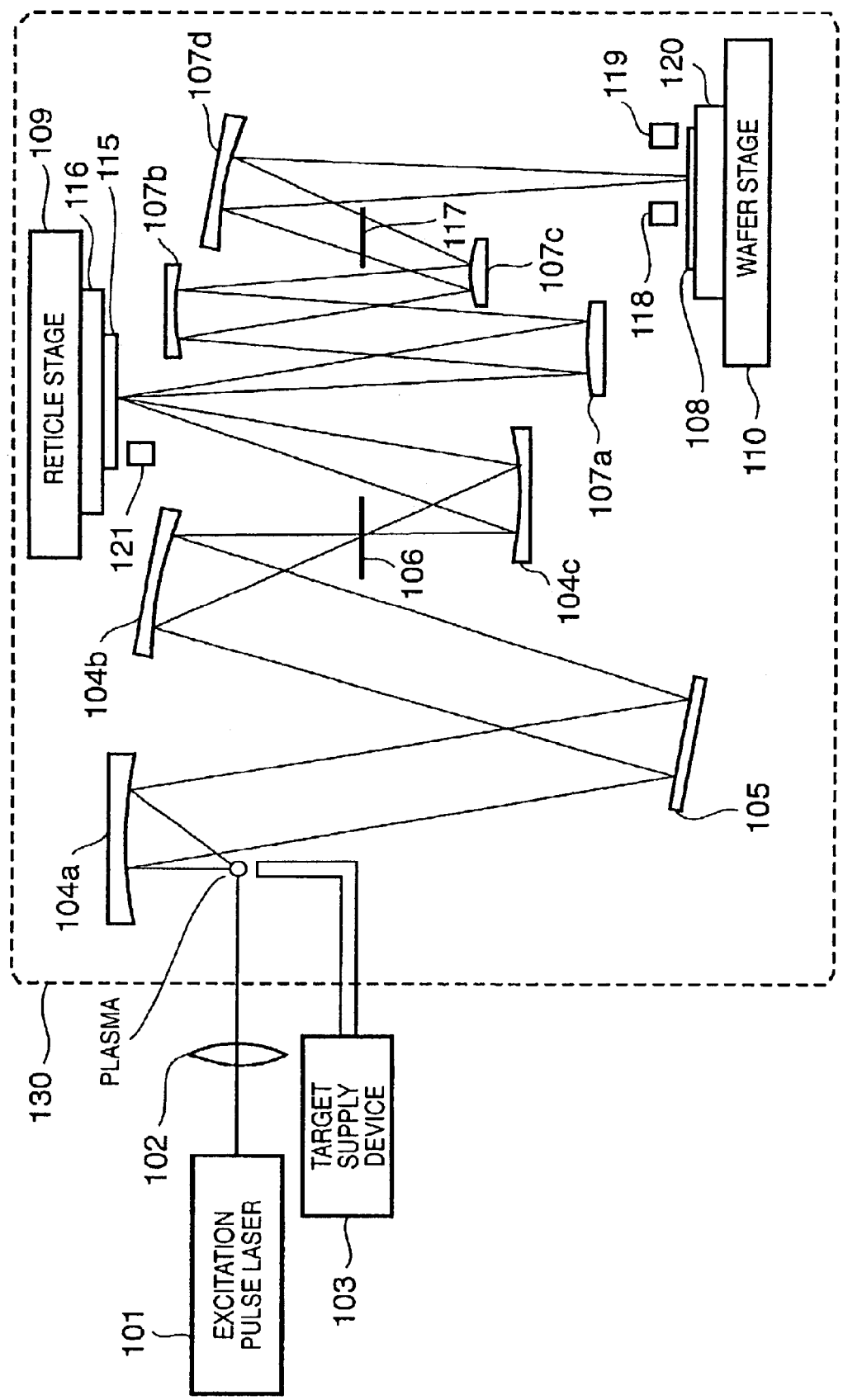
FIG. 13 is a view for explaining the arrangement of an exposure apparatus using EUV light.

FIG. 13 is a view showing the arrangement of an exposure apparatus using EUV light. An exposure apparatus (FIG. 1) according to the first embodiment comprises a timing control system 1 which controls the mirror figure in accordance with incident conditions, i.e., exposure conditions so as to always optimize the mirror figure for exposure in the exposure apparatus using EUV light, and a control data management database 111. The control data management database 111 stores data on the relationship between the incident light intensity, the incident time, and the cooling amount and timing of the mirror figure. The timing control system 1 controls a temperature adjustment system (to be described with reference to FIGS. 9 to 12) on the basis of data which are acquired in advance and stored in the control data management database 111, thereby cooling the mirror and controlling the mirror figure.

The exposure apparatus according to the first embodiment will be described with reference to FIGS. 1 to 9. A reduction projection exposure apparatus using EUV light is constituted by an exposure light source, an illumination optical system, a reflecting reticle, a projection optical system, a reticle stage, a wafer stage, an alignment optical system, a vacuum system, a timing control system which controls the exposure timing, and a temperature adjustment system which controls the mirror temperature so as to always optimize the mirror figure for exposure.

The arrangement of the exposure apparatus will be explained with reference to FIG. 1. The exposure light source is a laser produced by a plasma light source 101. This light source includes a condenser lens 102 and plasma target supply device 103, and emits EUV light. The illumination optical system includes mirrors (104a to 104c), an optical integrator 105, and a view angle restriction aperture 106 which shapes EUV light into an arcuate figure. The illumination optical system shapes a laser beam emitted by the plasma light source 101, and uniformly illuminates a reticle. The projection optical system has a plurality of mirrors (107a to 107d). The projection optical system reduces a reticle pattern formed on a reticle 115, and transfers the reduced pattern onto a wafer 108. At this time, a reticle stage 109 and wafer stage 110 are sync-scanned in accordance with the reduction ratio of the projection optical system.

The exposure apparatus executes exposure by repeating step & scan, and after exposure to the entire wafer surface is completed, processes the next wafer. Upon the completion of exposure to all wafers, the reticle is replaced, and exposure is repeated again by the same procedures. Exposure light incident conditions such as the interval between the preceding shot and the next shot change depending on each process such as step & scan, wafer replacement, or reticle replacement. To perform stable exposure, the mirror figure must be stabilized by substantially suppressing a change of the minor figure caused by heat generated for every irradiation of exposure light in accordance with exposure light incident conditions. The mirror figure is stabilized by controlling the mirror temperature in accordance with exposure light incident conditions. More specifically, a temperature adjustment systems, which controls the temperature of the mirror member, is arranged to enable controlling the mirror temperature. Temperature control conditions for the temperature adjustment system are specified for respective exposure light incident conditions so as to stabilize the mirror figure. In actual exposure, the temperature adjustment system is operated in accordance with the temperature control conditions.

To specify proper temperature adjustment conditions for the temperature adjustment system in accordance with respective exposure light incident conditions, the exposure apparatus is operated under the same exposure conditions as those of an actual apparatus. The mirror is irradiated with light at the same intensity and time interval as those of actual exposure light. While a change of the mirror figure by a temperature change is measured, the relationship between the figure change error and the temperature of the temperature adjustment system is obtained. An optimum control rule of the temperature adjustment system necessary to keep the figure constant is obtained.

An example of this control method will be explained with reference to the flow chart of FIG. 2 and FIGS. 4 to 7.

A case wherein the mirror figure is expressed by an incident light intensity P, an incident time t0, a temperature control energy P' of the temperature adjustment system, and a time difference $\Delta t'$ between the temperature control start time and the incidence start time will be described. In this case, (P', $\Delta t'$) are temperature adjustment system control parameters which minimize the mirror figure error. These parameters are represented by the parameters of incident conditions (P, t0), and determine a controlled variable.

Figure 2:
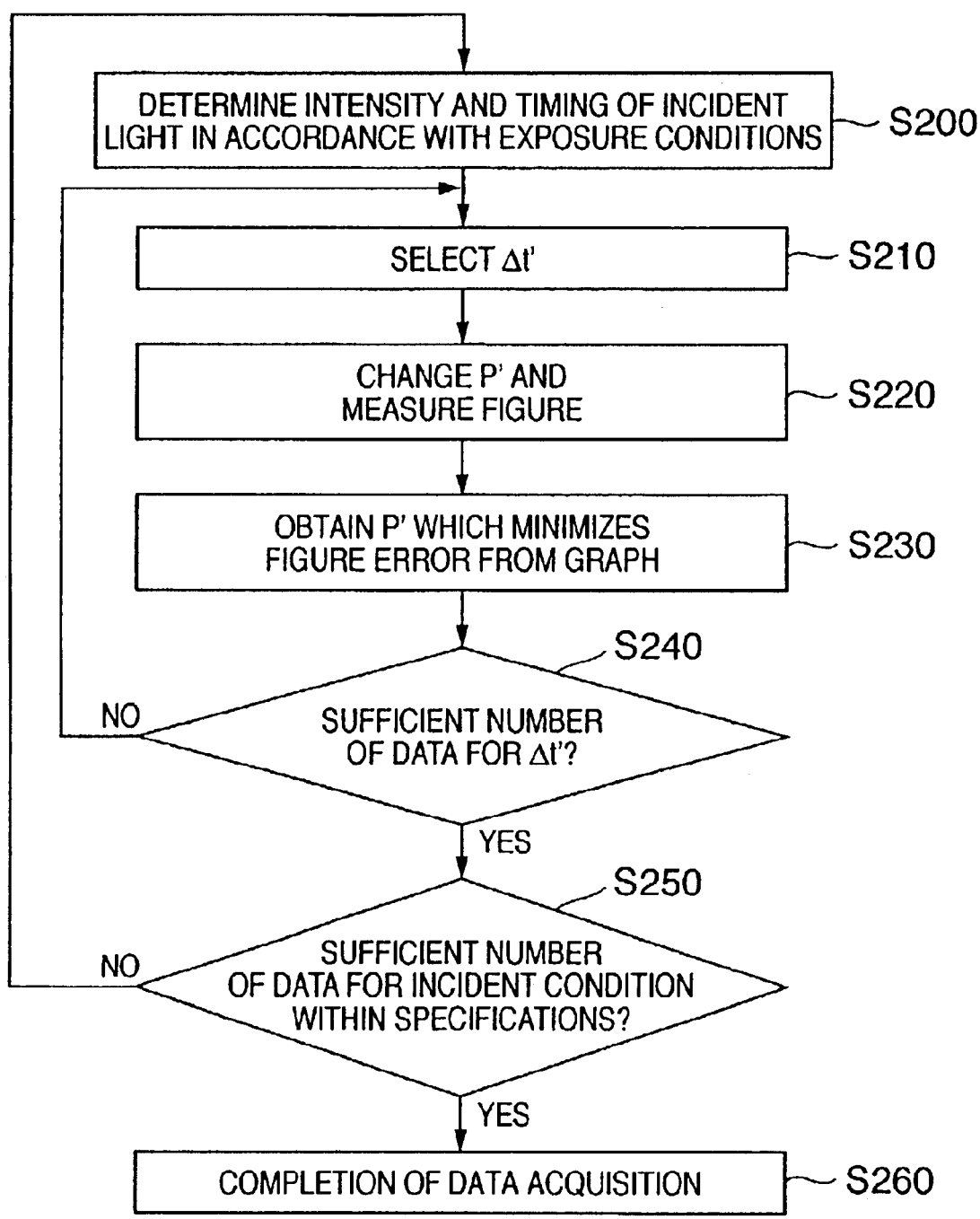
FIG. 2 is a flow chart for obtaining control of a temperature adjustment system necessary to optimize the mirror figure.
Figure 4:
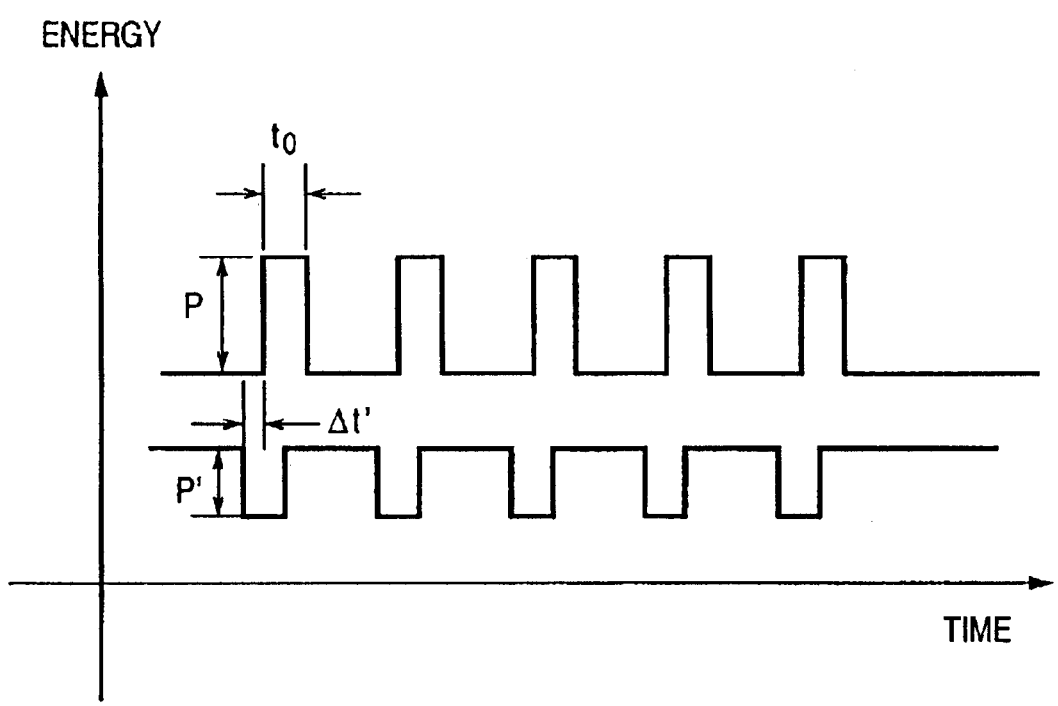
FIG. 4 is a graph showing the relationship between the temporary change of the intensity of light incident on a mirror and the temporary change of control of the temperature adjustment system.
Figure 5:
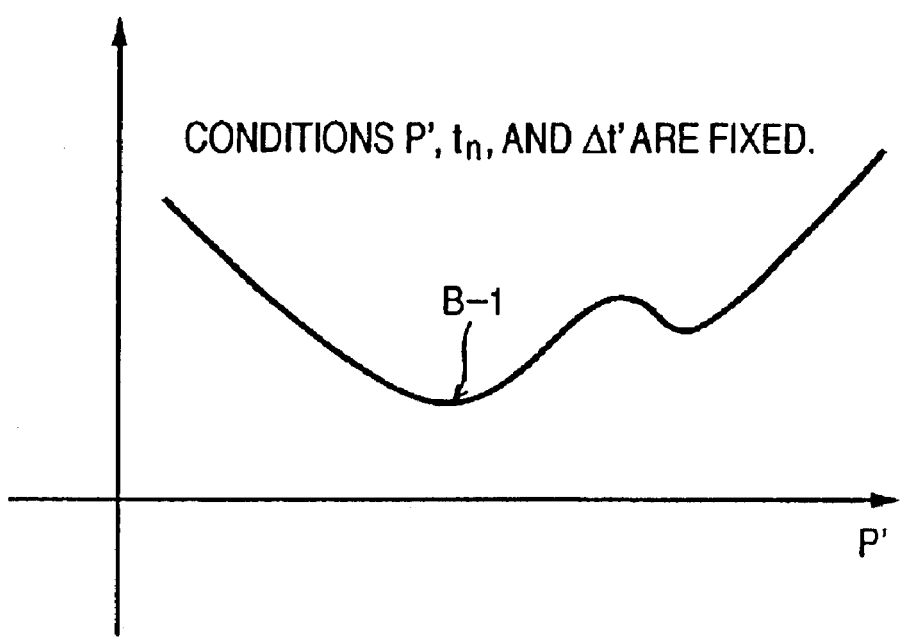
FIG. 5 is a graph for explaining an example of measuring a mirror figure error as a function of an output from the temperature adjustment system.

In step S200 of FIG. 2, the incident light intensity P and exposure timing t0 are determined in accordance with exposure conditions (upper pulse train in FIG. 4). A time difference $\Delta t'$ is selected (S210). While the temperature control energy P' of the temperature adjustment system is changed with the fixed time difference $\Delta t'$, the mirror figure error is measured by an interferometer (S220). A temperature control energy P' which minimizes the mirror figure error for $\Delta t'$ is obtained (S230: point at which B-1 in FIG. 5 becomes minimum in the error distribution). Processing in step S230 provides a temperature control energy P' which minimizes the mirror figure error for a predetermined time difference $\Delta t'$. The same measurement is performed while $\Delta t'$ is changed (S240), obtaining an optimum temperature control energy P' under a given incident condition. After that, the incident condition is changed, and the same procedures are repeated to execute measurement (S250). If a sufficient number of data are acquired for $\Delta t'$ and a sufficient number of data are acquired for the incident conditions within specifications (S200), data acquisition is completed (S260).

Figure 1:
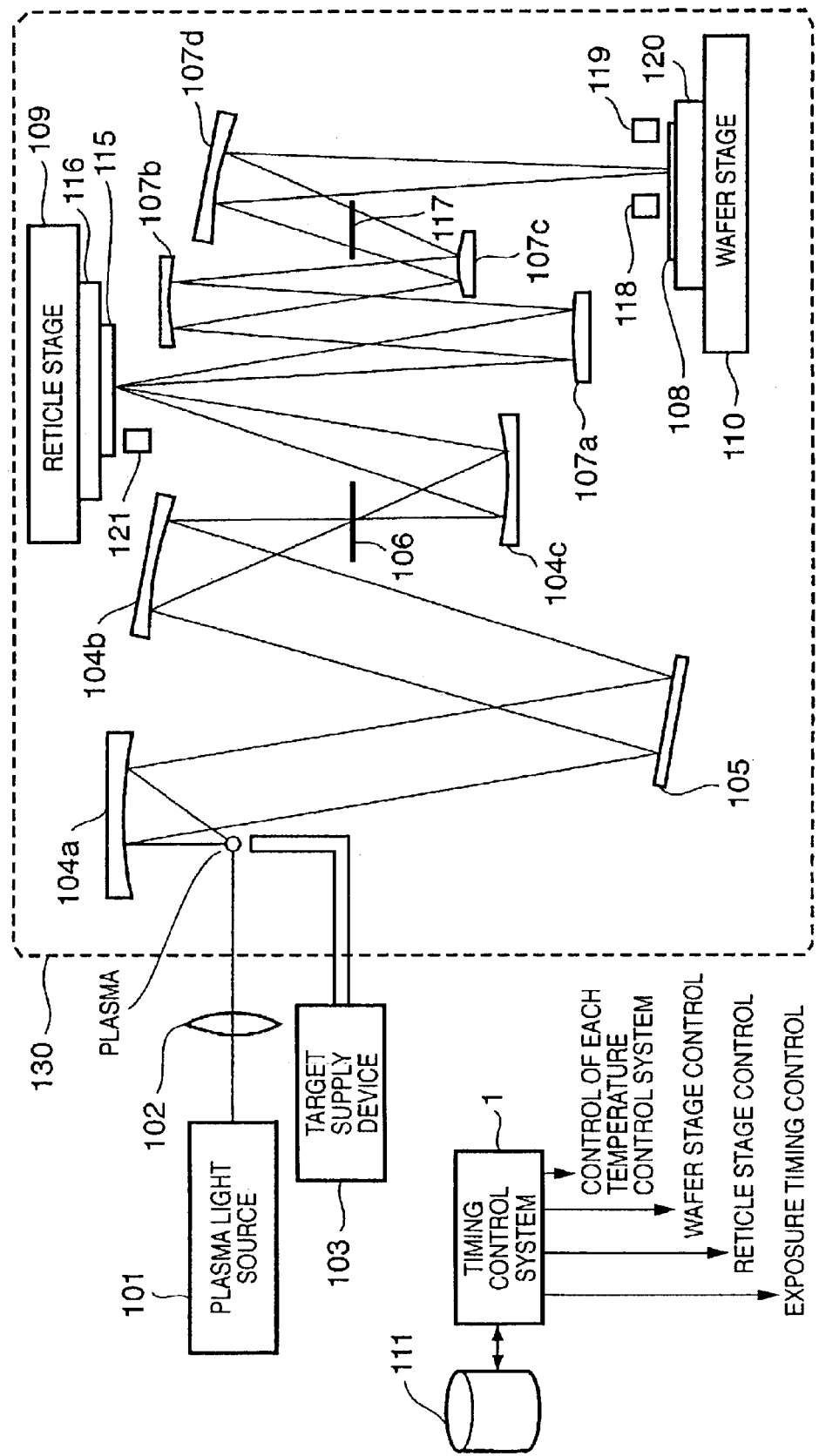
FIG. 1 is a view for explaining the arrangement of an exposure apparatus according to the present invention.

Data obtained by the above processing steps can be stored and managed as reference table data in the control data management database 111 in FIG. 1.

Figure 6:
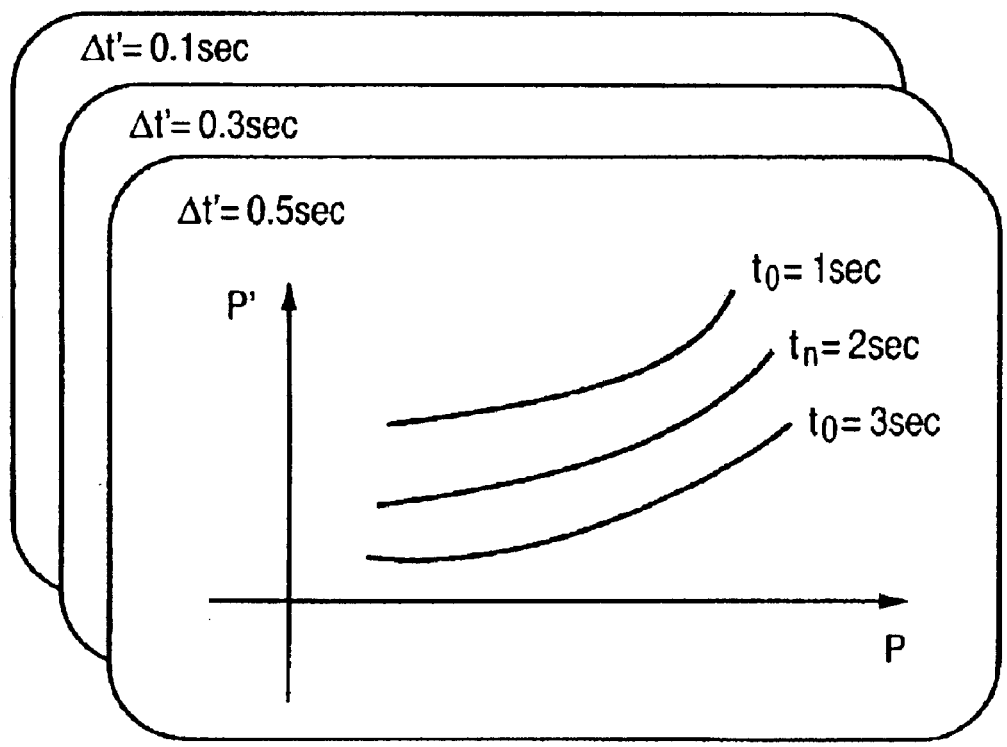
FIG. 6 is a graph for explaining plotted points at which the mirror figure error shown in FIG. 5 is minimized under respective exposure conditions.

(P', $\Delta t'$) which optimize the mirror figure may be approximated by the polynomial of the incident conditions (P, t0) on the basis of the obtained data. It is also possible that the relationship between the incident light intensity P and the temperature control energy P' of the temperature adjustment system upon changing the time difference $\Delta t'$ between the temperature control start time and the incidence start time to $\Delta t'$=0.1 sec, 0.3 sec, and 0.5 sec as shown in FIG. 6 is managed as reference table data, and changes of the relationship are plotted, as shown in FIG. 6.

The flow chart of FIG. 2 represents a processing flow of obtaining a condition which optimizes the mirror figure while changing the temperature control energy P' of the temperature adjustment system with a fixed time difference $\Delta t'$. The condition decision process is not limited to the above procedures. Alternatively, as shown in the flow chart of FIG. 3, the temperature control energy P' is first selected (S310), then the mirror figure error is measured while changing the time difference $\Delta t'$ (S320), and $\Delta t'$ which minimizes the mirror figure error is obtained (S330).

If a sufficient number of data are acquired for the temperature control energy P' of the temperature adjustment system and a sufficient number of data are acquired for the incident conditions (S300), data acquisition is completed (S360).

Data obtained by the above processing steps can be stored and managed as reference table data in the control data management database 111 in FIG. 1.

Figure 7:
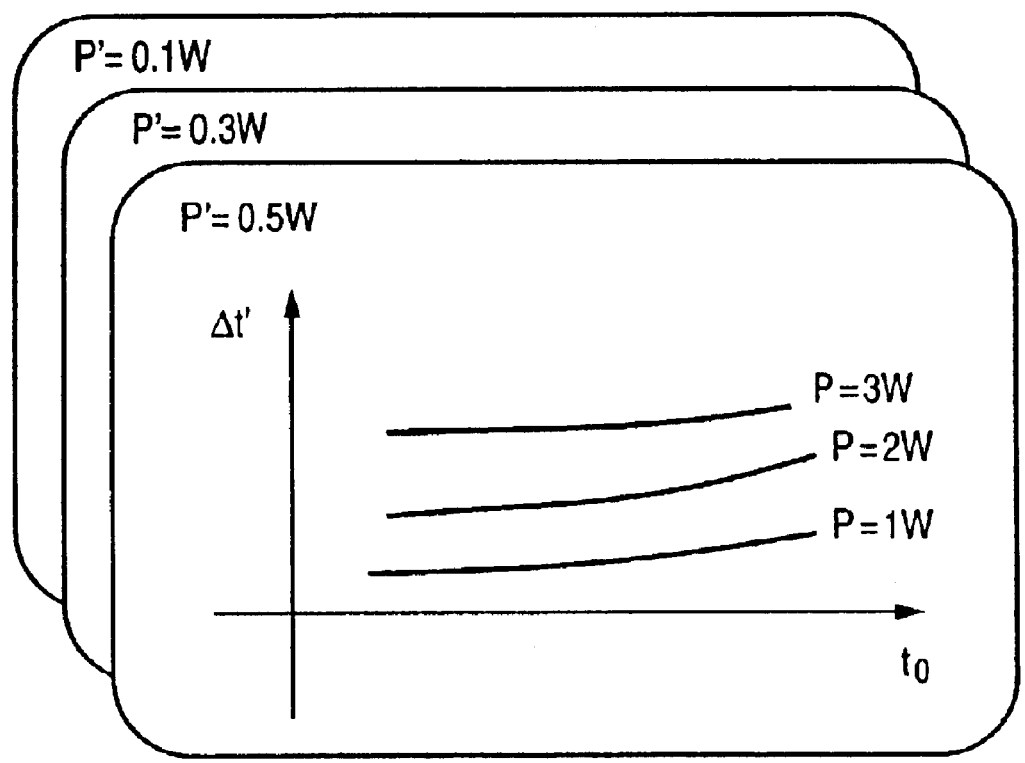
FIG. 7 is a graph for explaining plotted points at which the mirror figure error is minimized under respective exposure conditions in accordance with the flow chart of FIG. 3.

(P', $\Delta t'$) which optimize the mirror figure may be approximated by the polynomial of the incident conditions (P, t0) on the basis of the obtained data. It is also possible to manage, as reference table data, the relationship between $\Delta t'$ and t0 upon changing the temperature control energy P' of the temperature adjustment system to P'=0.1 W, 0.3 W, and 0.5 W as shown in FIG. 7, and to plot changes of the relationship, as shown in FIG. 7. In either case, the figure control precision increases with a larger number of measurement points.

In the above example, the incident conditions are represented by the parameters (P, t0), and the control parameters of the temperature adjustment system are (P', $\Delta t'$). However, the parameters are not limited to these four parameters. Also, when the number of parameters is increased, temperature adjustment system control parameters which minimize the mirror figure error are obtained while each parameter is changed. A larger number of parameters provide a higher mirror figure control precision. A series of operations of obtaining the polynomial and change table may be executed for each exposure apparatus or an arbitrary one of a plurality of exposure apparatuses having the same specifications.

In actual exposure, the operation of the temperature adjustment system is determined based on the polynomial or change table. The mirror figure becomes constant in an actual arrangement regardless of exposure conditions, and stable exposure can be achieved. That is, stable exposure can be realized by positively changing the mirror temperature so as to keep the mirror figure constant.

When the exposure apparatus incorporates an interferometer to always measure the mirror figure, the relationship between the mirror figure and the temperature adjustment system is obtained in advance, and stored and managed in the control data management database 111. The mirror figure is measured during exposure, and the temperature adjustment system works based on the data in the control data management database 111, to keep the mirror figure constant.

It is also possible to always measure the mirror figure, and accumulate, for each exposure processing, data of the temperature adjustment system which optimizes the figure. This data is assembled into a predetermined operation of the temperature adjustment system, which further optimizes the next exposure processing.

In the above description, the mirror figure is measured using an interferometer. When the relation between the image point of the mirror and the mirror figure is obtained, the mirror figure may be estimated from the image point.

Figure 9:
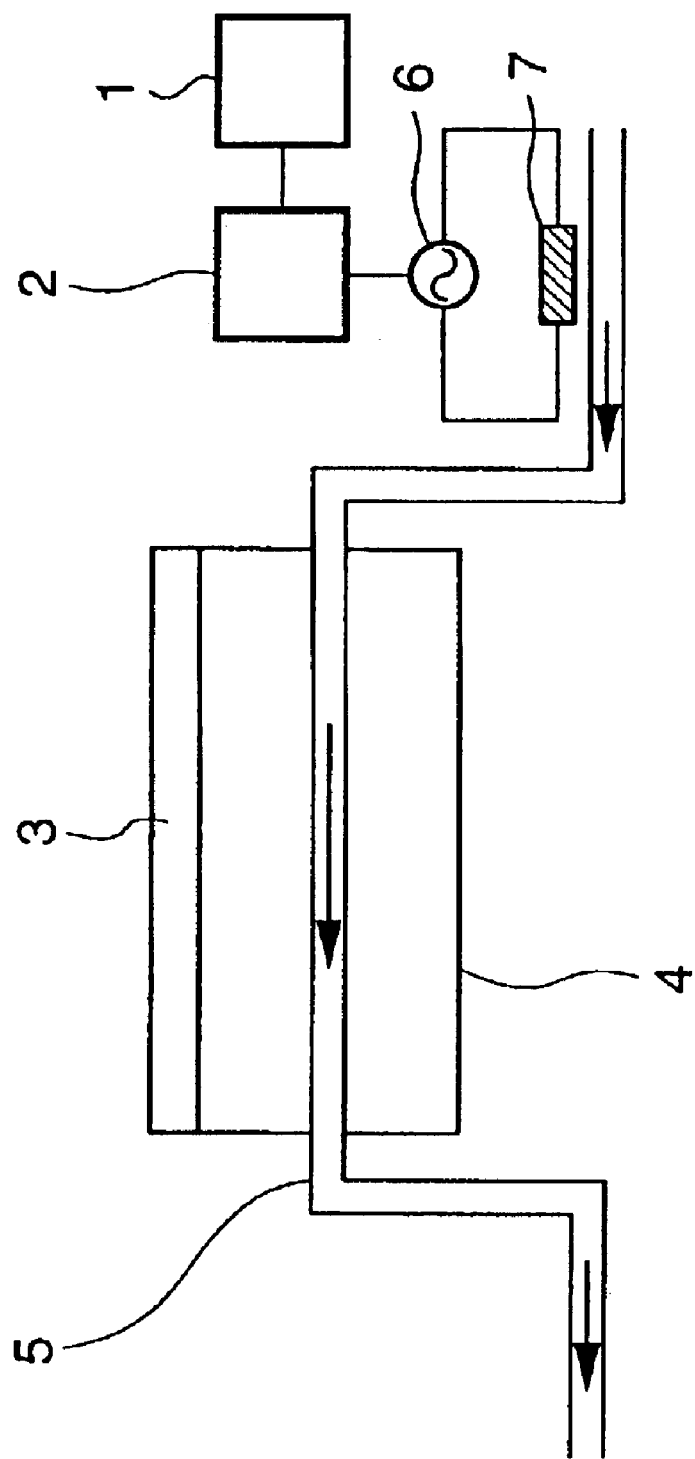
FIG. 9 is a view for explaining the arrangement of a mirror and mirror cooling portion according to the first embodiment of the present invention.

The arrangement of the temperature adjustment system near a mirror and mirror holding portion will be described with reference to FIG. 9. A cooling water channel 5 for adjusting the temperature is formed in a mirror holding portion 4. Cooling water circulates through the mirror holding portion 4 to control the temperature of a mirror 3. The temperature of cooling water is controlled by a heater 7 on the upstream side of the cooling water channel 5. The power of a heater power supply 6 is controlled via a temperature control system 2 by a signal from the timing control system 1.

The relationship between the mirror figure and the heater power (temperature adjustment) is obtained in advance. The heater 7 is operated as far as the temperature of the heater 7 can be controlled. The temperature of cooling water is changed, and the mirror figure at this temperature is repetitively measured. Data on the relationship between the mirror figure and the cooling temperature are collected, and the obtained data are input to the temperature control system 2. The data are always obtained and collected by an interferometer, and are used to keep the mirror figure constant regardless of changes in temperature.

Figure 3:
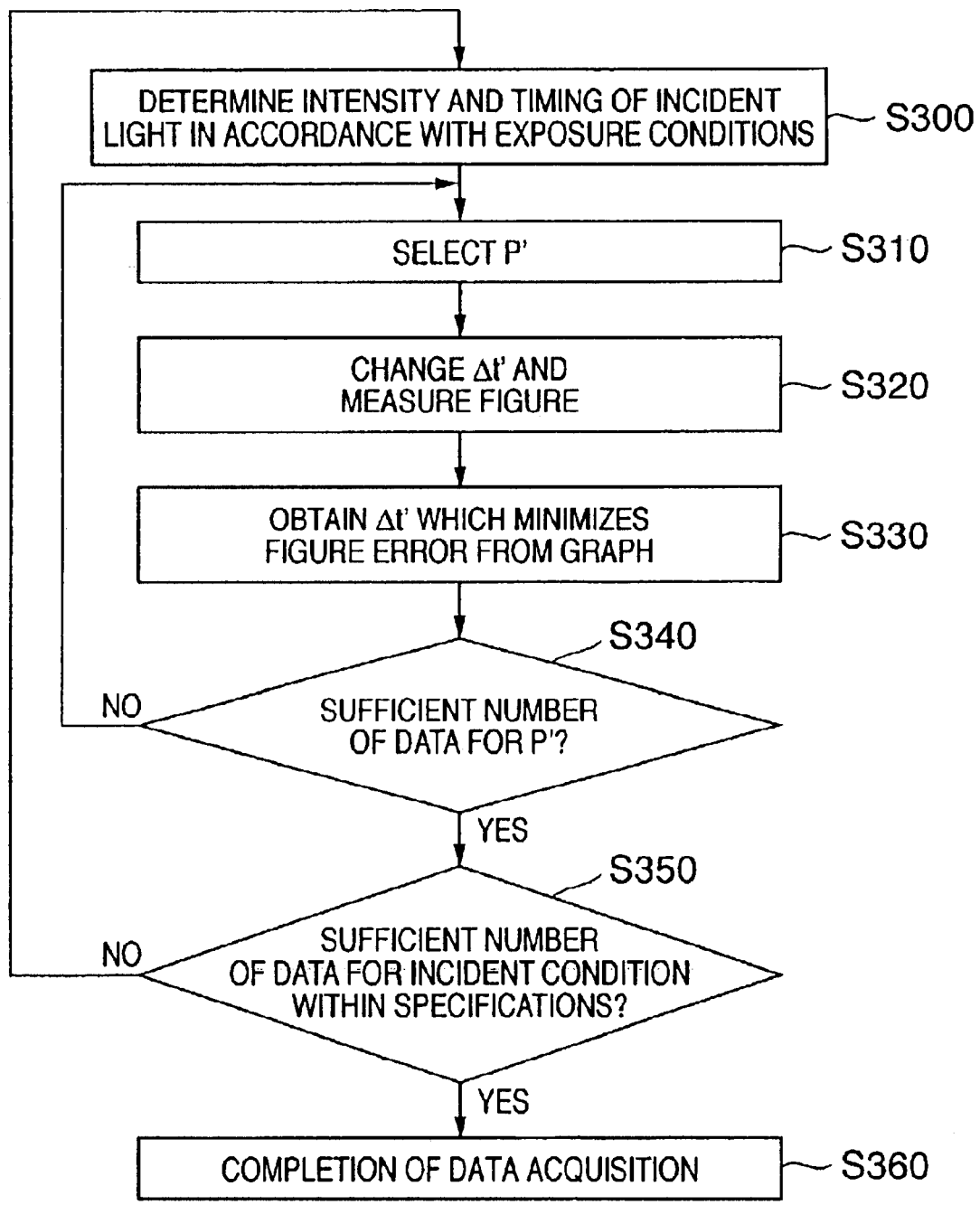
FIG. 3 is a flow chart for obtaining control of the temperature adjustment system necessary to optimize the mirror figure.

Note that the relationship between the mirror figure and the heater power (temperature adjustment) can be determined by the procedures shown in the flow charts of FIGS. 2 and 3.

Figure 8:
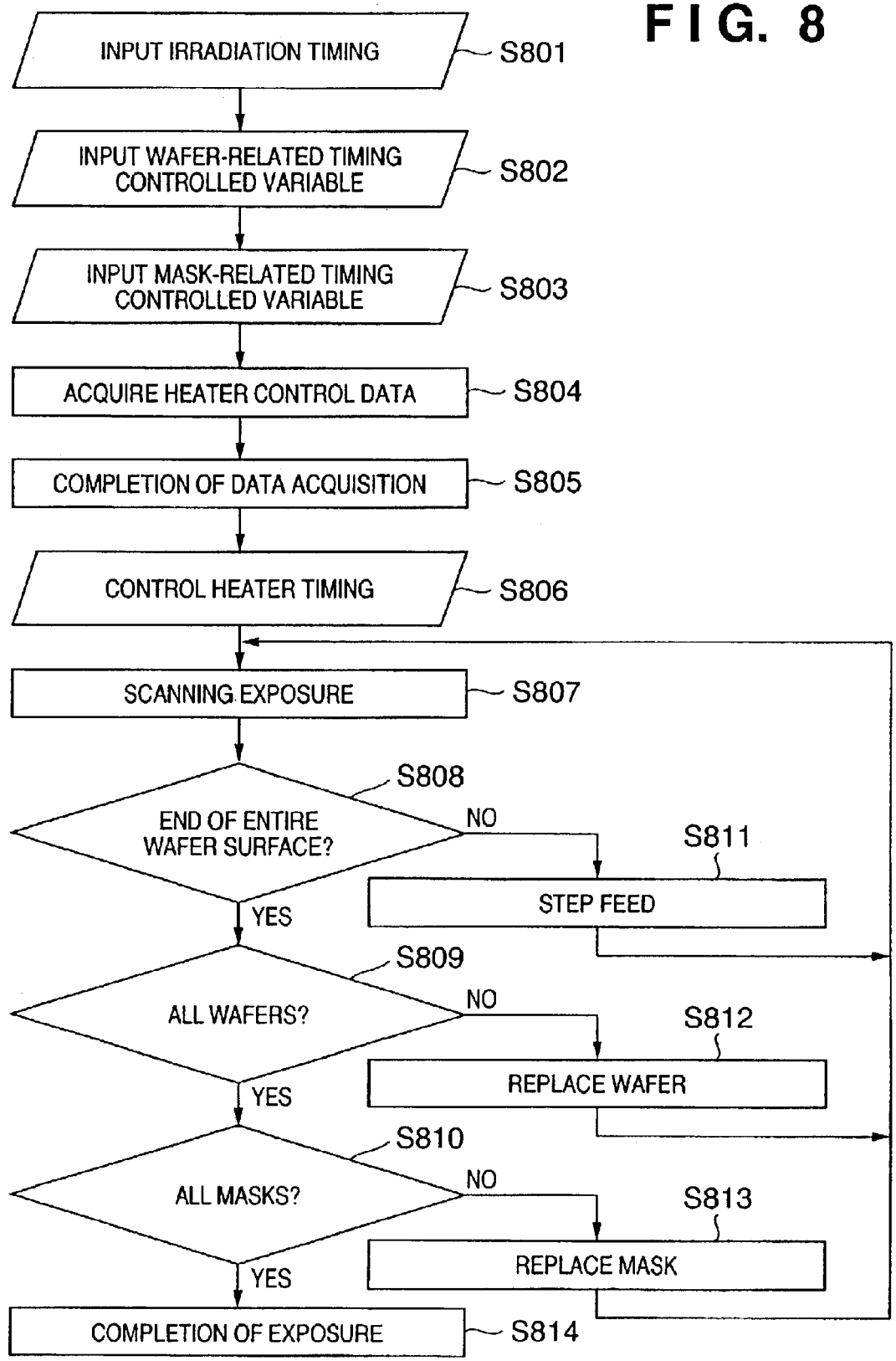
FIG. 8 is a flow chart for explaining a processing flow from acquisition of temperature control data to exposure.

The operation of the exposure apparatus from acquisition of temperature control data described above to exposure is shown in the flow chart of FIG. 8. The whole operation of the exposure apparatus is executed by the timing control system 1. The timing control system 1 controls the operation timings of the light source, reticle stage 109, wafer stage 110, and temperature control system. Exposure start and end signals are sent to a pulse laser which is a light source for the exposure (S801). The wafer stage 110 receives scanning start and end timings (S802), and the reticle stage 109 receives scanning start and end timings (S803).

The relationship between the intensity and time of exposure light incident on the mirror is determined when the timing controlled variables of the light source 101, reticle stage 109, and wafer stage 110 are input by the timing control system 1 in steps S801 to S803. After the intensity and time of exposure light is determined, the timing control system 1 acquires in step S804 control data from the control data management database 111 to be sent to the temperature control system 2.

Status of the change of the mirror figure is expressed by the incident light intensity P, the incident time t0, the temperature control energy P' of the temperature adjustment system, and the time difference Δt' between the temperature control start time and the incidence start time, as described above. In this case, the incident light intensity P and incident time t0 are the intensity and oscillation time of the pulse laser serving as a light source, respectively. The temperature control energy P' of the temperature adjustment system is supplied by the heater 7 inserted in the cooling water channel. The time difference Δt' between the cooling start time and the incidence start time corresponds to the difference between the time at which temperature adjustment of the heater power supply starts and the time at which laser oscilation starts. The exposure light intensity and the time are determined from the above mentioned relations. According to the exposure light intensity and the time, the control data management database 111, which is saved in advance as related data between the temperature control energy P' and the time difference Δt', is searched. The condition (P', Δt') which optimizes the mirror figure is determined based on the search. And the heater 7 is controlled based on the determined condition (P', Δt').

The control data management database 111 contains control data of the temperature control system for stabilizing a figure change caused by heat generation of the mirror upon irradiation of exposure light. Data which minimize the figure error are obtained from the control data management database 111 in accordance with various conditions (S805).

The data obtained in step S805 are input to the timing control system 1, and heat timing control is executed via the temperature control system 2 (S806).

Under the heater timing control, the heater power supply 6 is driven to control the heater 7, and a predetermined heat amount is applied to cooling water. The temperature of the mirror 3 held by the mirror holding portion 4 is stabilized by exchange of the heat amount by cooling water, suppressing any figure change caused by a temperature change.

Scanning exposure starts in step S807, and whether the entire wafer surface has been processed is checked (S808). If NO in step S808, the wafer stage moves to the next scanning exposure start position (S811). If YES in step S808, a wafer replacement signal is sent (NO in S809 and S812). Exposure start and end timings coincide with the scanning start (S807) and end (S814) of the stage. The wafer is replaced upon the completion of transfer to the entire wafer surface. The reticle (mask) is replaced (NO in S810 and S813) upon the completion of processing a predetermined number of wafers.

Details of heater timing control in step S806 and exposure operation will be explained.

The timing control system 1 controls the heater power supply 6 via the temperature control system 2 on the basis of heater control data acquired in steps S804 and S805. The heater 7 is operated under this control, and after a specific time has elapsed, i.e., the mirror is stabilized in a specific figure, an oscillation start signal is sent to the pulse laser to start exposure. At the same time, scanning start signals are sent to the reticle stage 109 and wafer stage 110, and transfer of the reticle pattern starts.

At the end of one scanning exposure, an oscillation end signal is sent to the pulse laser to end exposure. During exposure and even while the wafer stage moves to the next scanning exposure start position, the temperature control system 2 adjusts the heater power supply 6 and changes the mirror temperature in accordance with data input to the timing control system 1 in advance so as to keep the mirror figure constant. The exposure apparatus repeats step & scan, and after transfer to the entire wafer surface is completed, the wafer is replaced. This timing is also determined based on a signal which is input from the timing control system 1 in advance and sent to the wafer stage. The time necessary to replace wafers is different from the step & scan time interval. Even during this time, the heater power supply is controlled based on data measured in advance, and the mirror figure is kept constant. Upon the completion of transfer to a predetermined number of wafers, the reticle is replaced. Also, at this time, the mirror temperature is so controlled as to keep the mirror figure constant.

The figure of the mirror 3 is always measured by an interferometer, and the heater power is adjusted in accordance with data input to the timing control system 1. If the figure changes, the temperature control system 2 adjusts the power on the basis of mirror figure information from the interferometer in accordance with the relationship between the mirror figure and the heater power obtained in advance. Information on the operation timing of the temperature control system 2 and the figure change amount is input to the timing control system 1 to update information of the timing control system. The next exposure can be performed in accordance with the updated information.

As data update progresses, the mirror figure precision increases. After a satisfactory number of data update operations, information of the timing control system 1 is asymptotic to an ideal value. The heater power is adjusted in accordance with data input to the timing control system 1, keeping the figure constant. In exposure after information of the timing control system 1 is asymptotic to an ideal value, the mirror figure need not be measured by the interferometer. The use of data updated by a satisfactory number of times allows an exposure apparatus having the same specifications to perform stable exposure without any figure measurement by the interferometer.

In this manner, the mirror figure can be kept constant by changing the cooling water temperature in accordance with the exposure conditions and mirror figure. As a result, stable exposure can be achieved.

In the first embodiment, the polynomial and change table are obtained using a heater output parameter as an excitation laser parameter. The parameter may be the EUV light intensity observed on the wafer. In this case, a light intensity sensor is arranged on the wafer in acquiring data for creating a polynomial and change table, and a detected EUV light intensity and timing are used as parameters.

The EUV light intensity and time detected by the sensor on the wafer respectively correspond to the above-described incident light intensity P and incident time t0. In the above example, the polynomial and change table are obtained using a heater output parameter as an excitation laser parameter. The parameters may be the cooling water temperature on the downstream side of the heater and the temporary change of this temperature. In this case, a thermometer is set downstream of the heater, and a detected cooling water temperature and timing are used as parameters. The thermometer is electrically connected to the heater power supply, and the heater power is controlled while the cooling water temperature is measured. The cooling water temperature and timing detected by the thermometer respectively correspond to the above-described temperature control energy P' and time difference Δt' of the temperature adjustment system.

The first embodiment can provide an exposure apparatus capable of stably transferring a fine pattern without any decrease in resolution or contrast upon a change in reflecting surface figure caused by temperature variations of an optical element.

<Second Embodiment>

Figure 10:
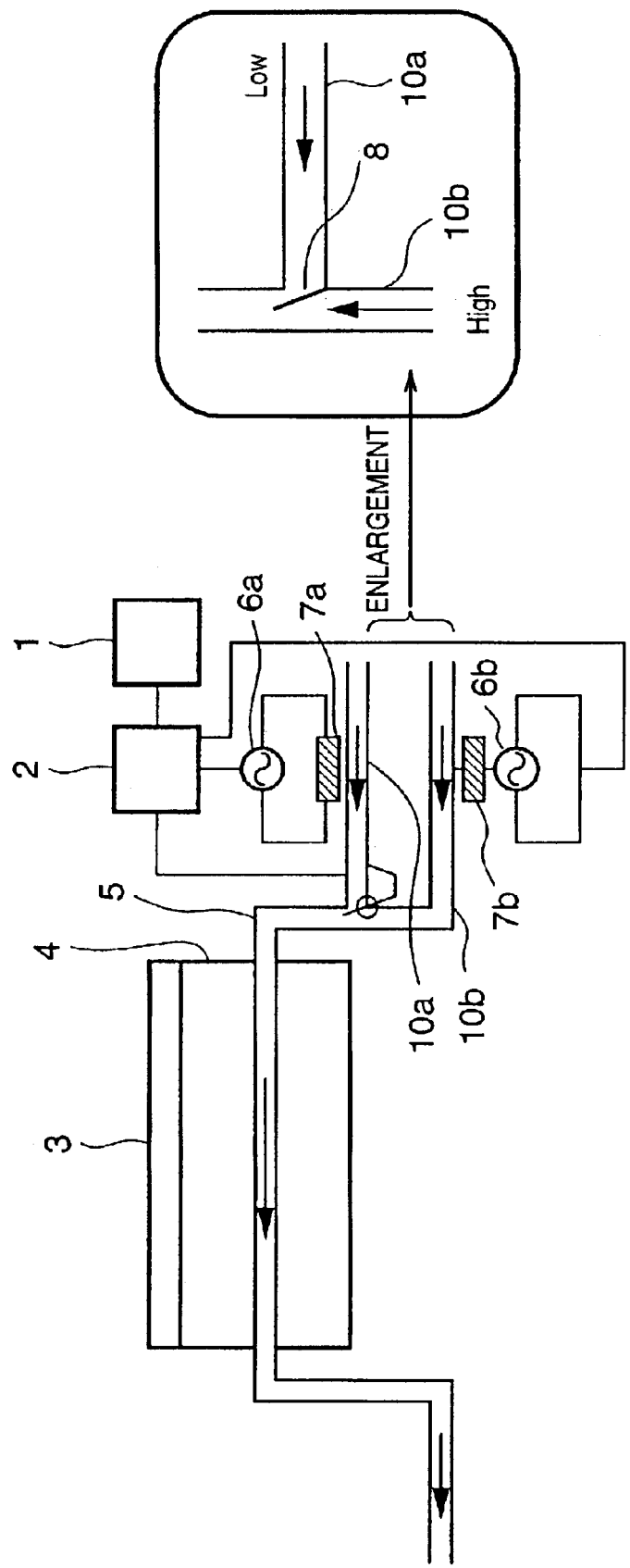
FIG. 10 is a view for explaining the arrangement of a mirror and mirror cooling portion according to the second embodiment of the present invention.

The second embodiment is different from the first embodiment in that a system having cooling water for two systems (10a and 10b) with different water temperatures, and a valve 8 for adjusting the flow rate of cooling water for each of these two systems is adopted as a cooling water temperature adjustment system, as shown in FIG. 10.

A timing control system 1 is connected to a temperature control system 2, and controls the temperature of cooling water for each system. The temperature control system 2 controls heater power supplies 6a and 6b and heaters 7a and 7b which respectively control the temperature of cooling water 10a for the first system and that of cooling water 10b for the second system. Further, the temperature control system 2 controls the opening/closing angle of the valve 8. By controlling the opening/closing angle of the valve 8, cooling water flowing through the first system and cooling water flowing through the second system can be controlled at a predetermined flow rate ratio. The temperature can be quickly switched based on the flow rate ratio.

Cooling water controlled to a predetermined flow rate ratio under the control of the valve 8 flows into a cooling water channel 5 and cools the backside of a mirror 3 via a mirror holding portion 4 which holds the mirror 3.

Similar to the first embodiment, the valve control timing of the temperature control system 2 is so controlled as to keep the mirror figure constant on the basis of data measured in advance by the timing control system 1.

According to the second embodiment, the cooling temperature can be quickly switched, and a change in reflecting surface figure caused by temperature variations of an optical element can be quickly suppressed.

<Third Embodiment>

Figure 11:
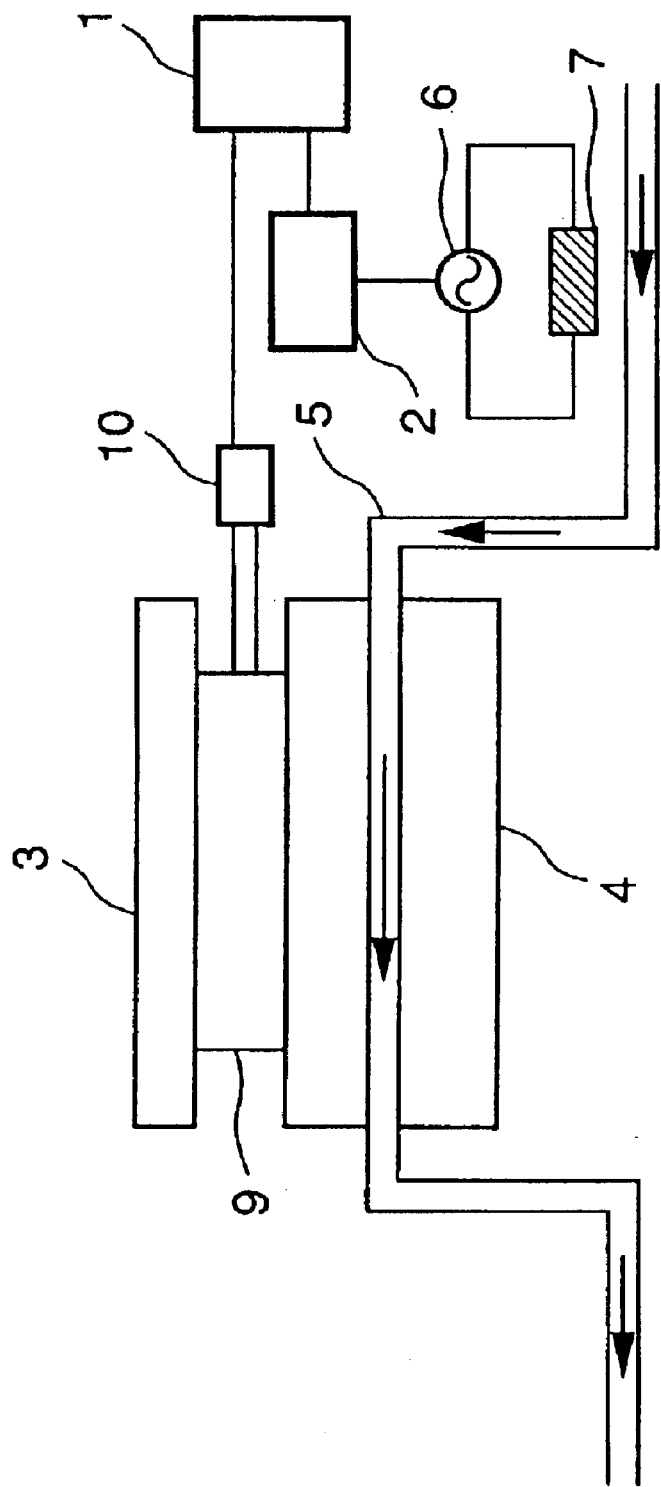
FIG. 11 is a view for explaining the arrangement of a mirror and mirror cooling portion according to the third embodiment of the present invention.

The third embodiment is different from the first embodiment in that a Peltier element 9 is interposed as a mirror temperature adjustment system between a mirror 3 and a mirror holding portion 4, as shown in FIG. 11. The Peltier element 9 is electrically connected to a timing control system 1 via a Peltier element power supply 10. The mirror 3 is heated or cooled in accordance with a current flowing through the Peltier element 9. Cooling water is supplied on the backside (mirror holding portion 4) of the Peltier element 9 because the Peltier element 9 dissipates heat absorbed from the mirror 3. A current is supplied from the timing control system 1 to the Peltier element. This timing is so controlled as to keep the mirror figure constant on the basis of data measured in advance by the timing control system 1, similar to the first embodiment.

The mediacy of the Peltier element 9 realizes cooling performance with a high response characteristic (follow-up characteristic) which copes with a steep temperature change in response to an instruction from the timing control system 1.

If vibrations generated by circulation of cooling water influence the mirror position or figure in the above embodiments, this can be solved by arranging a system, e.g., a heat pipe 12 which buffers transfer of vibrations and conducts heat between the mirror 3 and the mirror holding portion. FIG. 12 shows this arrangement. The heat pipe 12 has a function of conducting heat from the mirror 3 to the cooling portion 4, and is attached to the mirror 3 directly or via a high-thermal-conductivity metal plate 11 which is attached to the backside of the mirror. The heat pipe may be equipped with a damping system such as a bellows, which damps vibrations. A plurality of heat pipes 12 or only one heat pipe 12 may be arranged.

The present invention has been described in terms of an apparatus which starts exposure by oscillation of a pulse laser. The present invention is not limited to this, and can also be applied to an exposure apparatus which performs exposure by opening/closing a shutter arranged at a part of the illumination system at the start/end of exposure.

The embodiment using cooling water and a Peltier element as a temperature adjustment system has been described, but the temperature adjustment system is not limited to them.

According to the third embodiment, cooling performance with a high response characteristic (follow-up characteristic) which copes with a steep temperature change can be realized by interposing the Peltier element, in addition to cooling by circulation of cooling water. The influence of vibrations by circulation of cooling water can be eliminated.

<Embodiment of a Semiconductor Production System>

A production system for a semiconductor device (e.g., a semiconductor chip such a an IC or LSI, a liquid crystal panel, a CCD, a thin-film magnetic head, a micromachine, or the like) using the exposure apparatus will be exemplified. The system performs maintenance services such as trouble shooting, periodic maintenance, and software distribution for manufacturing apparatuses installed in a semiconductor manufacturing factory by utilizing a computer network outside the manufacturing factory.

Figure 14:
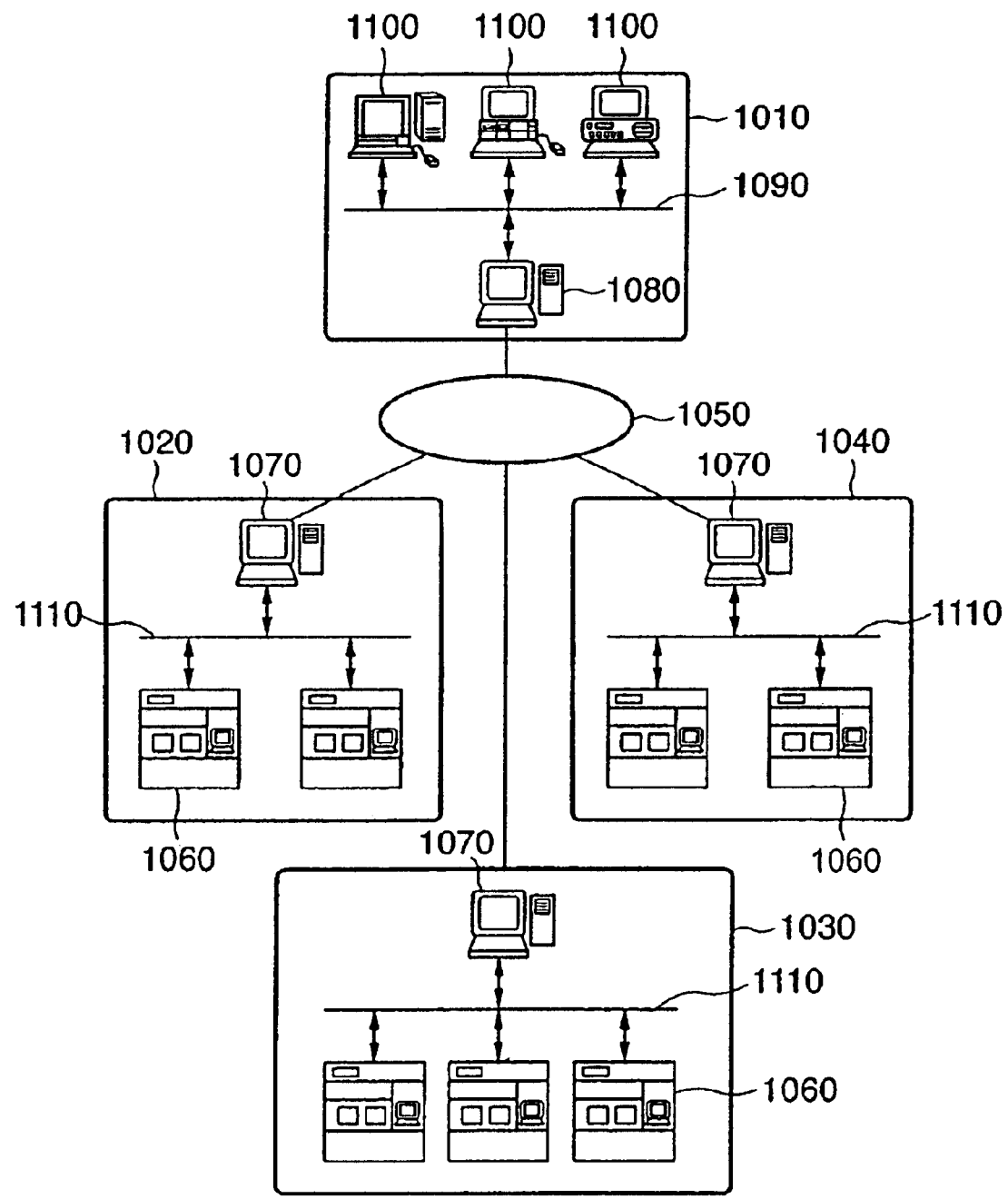
FIG. 14 is a view showing the concept of a semiconductor device production system including an exposure apparatus according to an embodiment of the present invention when viewed from a given angle.

FIG. 14 shows the overall system cut out at a given angle. In FIG. 14, reference numeral 1010 denotes an office of a vendor (apparatus supply manufacturer) which provides a semiconductor device manufacturing apparatus. Examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The office 1010 comprises a host management system 1080 which provides a maintenance database for the manufacturing apparatus, a plurality of operation terminal computers 1100, and a LAN (Local Area Network) 1090 which connects the host management system 1080 and computers 1100 to build an intranet. The host management system 1080 has a gateway for connecting the LAN 1090 to Internet 1050 serving as an external network of the office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus which monitors the operation status of each manufacturing apparatus 1060.

The host management system 1070 in each of the factories 1020 to 1040 has a gateway for connecting the LAN 1110 in the factory to the Internet 1050 serving as an external network of the factory. Each factory can access the host management system 1080 of the vendor 1010 from the LAN 1110 via the Internet 1050. The security function of the host management system 1080 typically permits only a limited user to access the host management system 1080.

In this system, the factory can notify the vendor via the Internet 1050 of status information (e.g., the symptom of a manufacturing apparatus in trouble) representing the operation status of each manufacturing apparatus 1060. Also, the vendor can transmit, to the factory, response information (e.g., information designating a remedy against the trouble, or remedy software or data) corresponding to the notification, or maintenance information such as the latest software or help information. Data communication between the factories 1020 to 1040 and the vendor 1010 and data communication via the LAN 1110 in each factory typically adopt a communication protocol (TCP/IP) generally used in the Internet.

Instead of using the Internet as an external network of the factory, a high-security dedicated network (e.g., ISDN) which inhibits access of a third party can be adopted. The host management system is not limited to the one provided by the vendor. The user may construct a database and set the database on an external network, and the host management system may authorize access to the database from a plurality of user factories.

Figure 15:
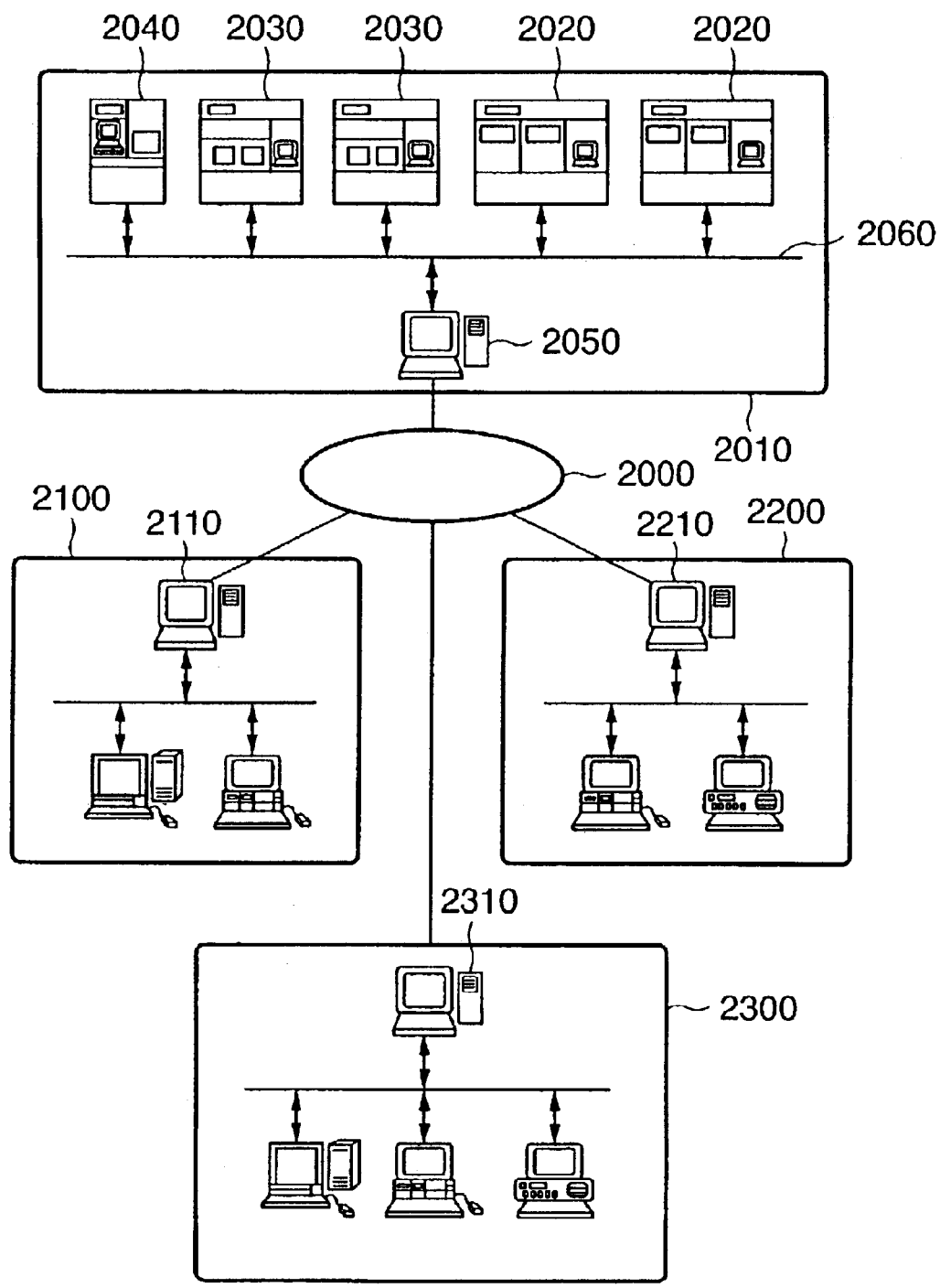
FIG. 15 is a view showing the concept of the semiconductor device production system including the exposure apparatus according to the embodiment of the present invention when viewed from another angle.

FIG. 15 is a view showing the concept of the overall system of this embodiment that is cut out at a different angle from FIG. 14. In the above example, a plurality of user factories having manufacturing apparatuses and the management system of the manufacturing apparatus vendor are connected via an external network, and production management of each factory or information about at least one manufacturing apparatus is communicated via the external network. In the example of FIG. 15, a factory having a plurality of manufacturing apparatuses provided by a plurality of vendors and the management systems of the vendors for these manufacturing apparatuses are connected via the external network of the factory, and maintenance information about each manufacturing apparatus is communicated. In FIG. 15, reference numeral 2010 denotes a manufacturing factory of a manufacturing apparatus user (e.g., a semiconductor device manufacturer). Manufacturing apparatuses for performing various processes, e.g., an exposure apparatus 2020, a resist processing apparatus 2030, and a film formation apparatus 2040 are installed in the manufacturing line of the factory.

FIG. 15 shows only one manufacturing factory 2010, but a plurality of factories are networked in practice. The respective apparatuses in the factory are connected to each other by a LAN 2060 to build an intranet, and a host management system 2050 manages the operation of the manufacturing line. The offices of vendors (e.g., apparatus supply manufacturers) such as an exposure apparatus manufacturer 2100, a resist processing apparatus manufacturer 2200, and a film formation apparatus manufacturer 2300 comprise host management systems 2110, 2210, and 2310 for executing remote maintenance for the supplied apparatuses. Each host management system has a maintenance database and a gateway for an external network, as described above. The host management system 2050, which manages the apparatuses in the manufacturing factory of the user, and the management systems 2110, 2210, and 2310 of the vendors for the respective apparatuses are connected via the Internet or dedicated network serving as an external network 2000. In this system, if trouble occurs in any one of the manufacturing apparatuses along the manufacturing line, the operation of the manufacturing line stops. This trouble can be quickly solved by remote maintenance from the vendor of the apparatus in trouble via the Internet 2000. This can minimize the stoppage of the manufacturing line.

Each manufacturing apparatus in the semiconductor manufacturing factory comprises a display, a network interface, and a computer which executes network access software and apparatus operating software that are stored in a storage device. The storage device is a built-in memory, hard disk, or network file server. The network access software includes a dedicated or general-purpose web browser, and provides a user interface with a window as shown in FIG. 16 on the display. While referring to this window, the operator who manages manufacturing apparatuses in each factory inputs, into input fields on the windows, pieces of information such as the model of manufacturing apparatus (4010), serial number (4020), subject of trouble (4030), date of occurrence of trouble (4040), degree of urgency (4050), symptom (4060), remedy (4070), and progress (4080). The pieces of input information are transmitted to the maintenance database via the Internet, and appropriate maintenance information is sent back from the maintenance database and provided on the display. The user interface provided by the web browser realizes hyperlink functions (4100 to 4120), as shown in FIG. 16. This allows the operator to access more detailed information of each item, download the latest-version software to be used for a manufacturing apparatus from a software library provided by a vendor, and download an operation guide (help information) as a reference for the operator in the factory.

Figure 17:
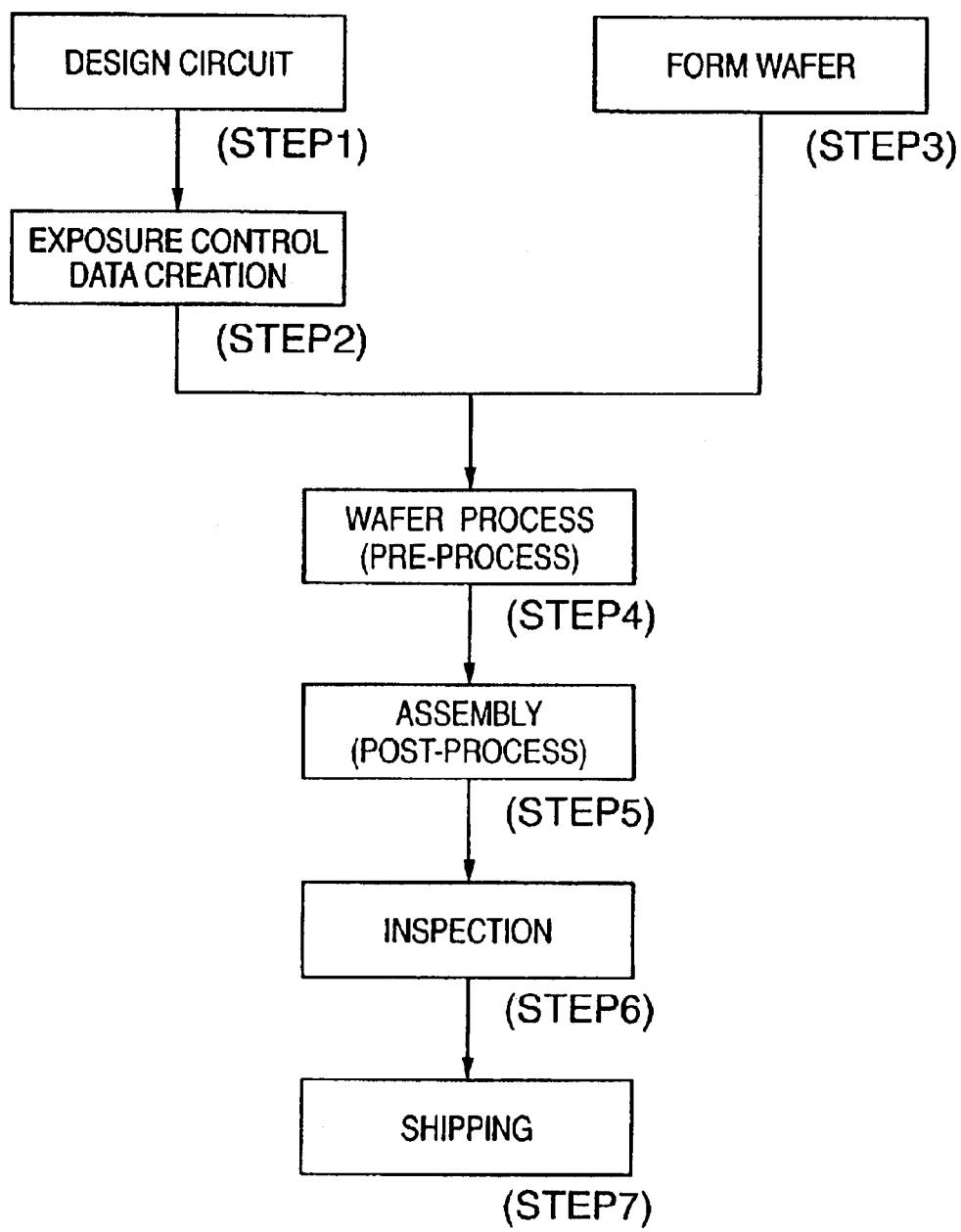
FIG. 17 is a flow chart for explaining the flow of a device manufacturing process by the exposure apparatus according to the embodiment of the present invention.

A semiconductor device manufacturing process using the above-described production system will be explained. FIG. 17 shows the flow of the whole manufacturing process of a semiconductor device. In step 1 (circuit design), a semiconductor device circuit is designed. In step 2 (exposure control data creation), exposure control data for an exposure apparatus is created on the basis of the designed circuit pattern. In step 3 (wafer formation), a wafer is formed using a material such as silicon. In step 4 (wafer process), called a pre-process, an actual circuit is formed on the wafer by lithography using a the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7). For example, the pre-process and post-process maybe performed in separate dedicated factories. In this case, each of the factories receives maintenance by the above-described remote maintenance system. Information for production management and apparatus maintenance is communicated between the pre-process factory and the post-process factory via the Internet or dedicated network.

Figure 18:
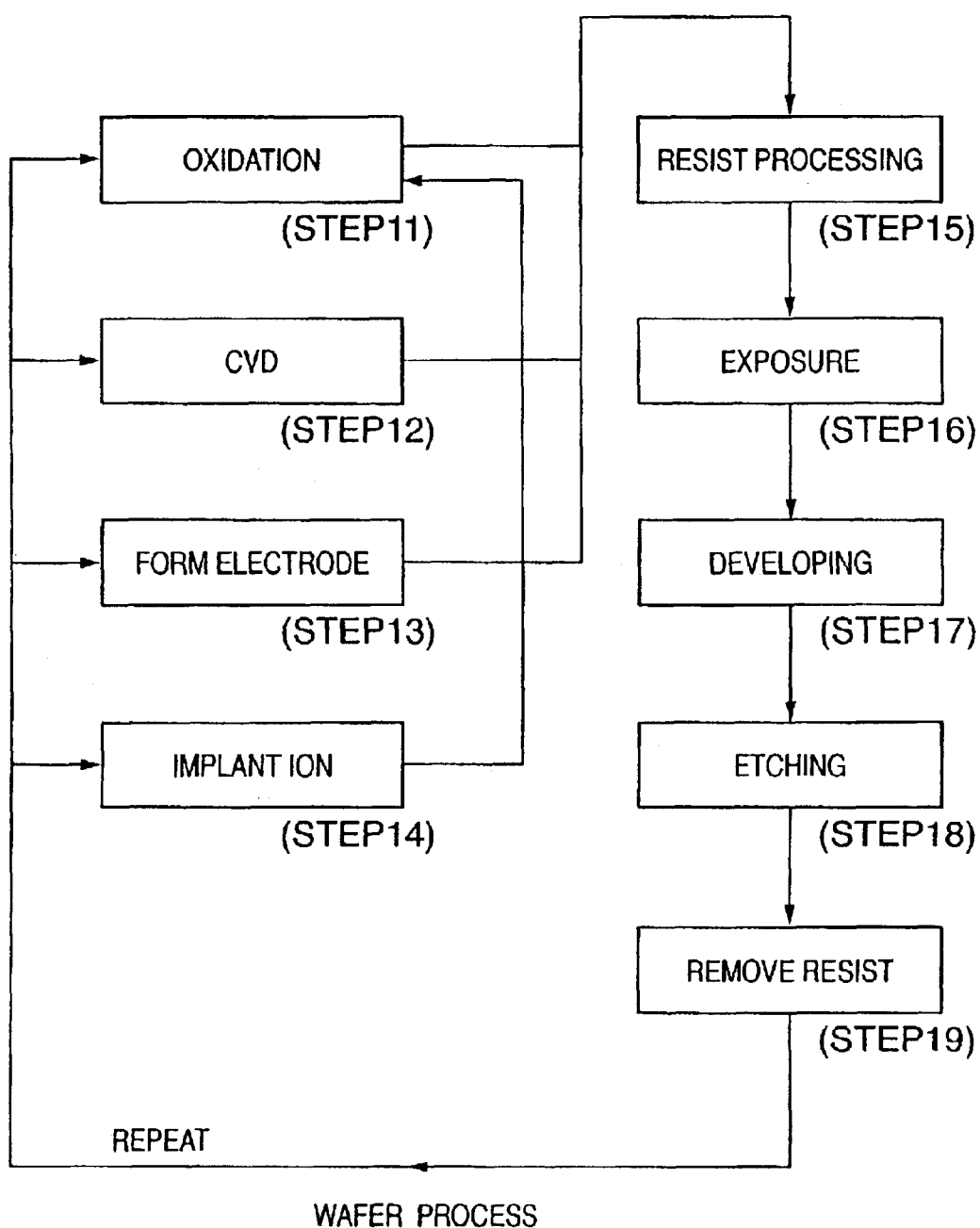
FIG. 18 is a flow chart for explaining a wafer process by the exposure apparatus according to the embodiment of the present invention.

FIG. 18 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is drawn (exposure) onto the wafer by the above-mentioned exposure apparatus. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The semiconductor device productivity can be increased in comparison with the prior art.

As has been described above, the present invention can easily control a figure change of the mirror (reflecting surface) in accordance with exposure conditions, and realize exposure at a stable precision.

The present invention can provide an exposure apparatus capable of stably transferring a fine pattern while properly preventing any decrease in resolution or contrast upon a change in reflecting surface figure caused by temperature variations of an optical element, and a semiconductor device manufacturing method using the exposure apparatus.

As many apparently widely different embodiments of the present invention can be made without departing from the spirit and scope thereof, it is to be understood that the invention is not limited to the specific embodiments thereof except as defined in the claims.

What is claimed is:

1. A mirror device which includes an optical system of an exposure apparatus for transferring a reticle pattern onto a wafer, said mirror device comprising:
   a mirror for reflecting exposure light;
   a mirror holding portion for holding the mirror;
   a temperature adjustment unit for adjusting a temperature of the mirror and the mirror holding portion;
   a control management database for storing data about a controlling rule of the temperature adjustment unit necessary to keep a mirror figure constant for an incidence condition of the reflected exposure light; and
   a timing control unit for controlling;
   an adjustment of the temperature by said temperature adjustment unit based on the data about the controlling rule stored in said control management database.

2. The device according to claim 1, further comprising means for measuring a change of the mirror figure.

3. The device according to claim 1, wherein the temperature adjustment is performed by circulating a heating or cooling medium through the mirror.

4. The device according to claim 1, wherein the temperature adjustment is performed by arranging a Peltier element on the mirror.

5. The device according to claim 1, wherein the temperature adjustment is performed to cancel a change of the mirror figure caused by heat from the exposure light incident on the mirror surface.

6. The device according to claim 1, wherein the mirror comprises a multilayer film prepared by alternately stacking two types of substances having different optical constants.

7. An exposure apparatus which transfers a reticle pattern onto a wafer, comprising:
   a light source which emits exposure light;
   an illumination optical system which includes a mirror device and guides the exposure light emitted by said light source to a reticle; and
   a projection optical system which includes a mirror device and guides the exposure light reflected by the reticle to the wafer,
   wherein at least one of the illumination optical system mirror device and the projection optical system mirror device is a mirror device according to any one of claims 1, 2, 3, 4, 5, and 6.

8. A semiconductor device manufacturing method comprising the steps of:
   installing a plurality of semiconductor manufacturing apparatuses including an exposure apparatus in a factory; and
   manufacturing a semiconductor device by using the plurality of semiconductor manufacturing apparatuses,
   wherein the exposure apparatus has:
   a light source which emits exposure light,
   an illumination optical system which includes a mirror device and guides the exposure light emitted by said light source to a reticle, and
   a projection optical system which includes a mirror device and guides the exposure light reflected by the reticle to the wafer,
   wherein at least one of the illumination optical system mirror device and the projection optical system mirror device is a mirror device according to any one of claims 1, 2, 3, 4, 5, and 6.

9. The method according to claim 8, further comprising the steps of:
   connecting the plurality of semiconductor manufacturing apparatuses to a local area network;
   connecting the local area network to an external network outside the factory;
   acquiring information about the exposure apparatus from a database on the external network by using the local area network and the external network; and controlling the exposure apparatus on the basis of the acquired information.

10. A semiconductor manufacturing factory comprising:
a plurality of semiconductor manufacturing apparatuses including an exposure apparatus;
a local area network which connects said plurality of semiconductor manufacturing apparatuses; and
a gateway which connects said local area network to an external network outside the semiconductor manufacturing factory,
wherein the exposure apparatus: a light source which emits exposure light,
an illumination optical system which includes a mirror device and guides the exposure light emitted by said light source to a reticle, and
a projection optical system which includes a mirror device and guides the exposure light reflected by the reticle to the wafer,
wherein at least one of the illumination optical system mirror device and the projection optical system mirror device is a mirror device according to any one of claims 1, 2, 3, 4, 5, and 6.

11. An exposure apparatus maintenance method comprising the steps of:
preparing a database for accumulating information about maintenance of an exposure apparatus on an external network outside a factory where the exposure apparatus is installed;
connecting the exposure apparatus to a local area network in the factory; and
maintaining the exposure apparatus on the basis of the information accumulated in the database by using the external network and the local area network,
wherein the exposure apparatus has:
a light source which emits exposure light,
an illumination optical system which includes a mirror device and guides the exposure light emitted by the light source to a reticle, and
a projection optical system which includes a mirror device and guides the exposure light reflected by the reticle to the wafer,
wherein at least one of the illumination optical system mirror device and the projection optical system mirror device is a mirror device according to any one of claims 1, 2, 3, 4, 5, and 6.

12. The device according to claim 1, wherein the data about the controlling rule of the temperature adjustment unit necessary to keep the mirror figure constant include an incident exposure light intensity, an incident time, a temperature control energy of the temperature adjustment unit, and a temperature control start time.

13. The device according to claim 3, wherein the temperature adjustment is performed by adjusting a temperature of the heating or cooling medium through the mirror holding portion.

14. The device according to claim 13, wherein the temperature of the heating or cooling medium is adjusted by changing the flow rate of the heating or cooling medium.

15. A method of controlling a mirror surface figure of a mirror device which includes an optical system of an exposure apparatus for transferring a reticle pattern onto a wafer, said method comprising the steps of:
storing data about a temperature controlling rule of a temperature adjustment unit necessary to keep a mirror surface figure of a mirror constant for an incidence condition of exposure light;
inputting a condition of exposure light incident on the mirror surface;
inputting a condition for the temperature controlling rule corresponding to the condition of the exposure light; and
controlling an adjustment of the temperature by the temperature adjustment unit based on the data about the temperature controlling rule stored in said storing step.

16. The method according to claim 15, wherein the temperature of the mirror is controlled by circulating a heating medium through the mirror.

17. The method according to claim 15, wherein the temperature of the mirror is controlled by arranging a Peltier element on the mirror.

18. An exposure method of transferring a reticle pattern onto a wafer, comprising the steps of:
guiding exposure light emitted by a light source for emitting exposure light, to a reticle by an illumination optical system which includes a mirror device; and
guiding the exposure light reflected by the reticle to a wafer by a projection optical system which includes a mirror device,
wherein at least one of the illumination optical system mirror device and the projection optical system mirror device is controlled by the method according to any one of claims 15, 16, and 17.

19. The method according to claim 15, wherein the data about the controlling rule of the temperature adjustment unit necessary to keep the mirror surface figure constant include an incident exposure light intensity, an incident time, a temperature control energy of the temperature adjustment unit and a temperature control start time.

20. The method according to claim 16, wherein the temperature of the mirror is controlled by adjusting temperature of the heating or cooling medium through the mirror holding portion.

21. The method according to claim 20, wherein the temperature of the heating or cooling medium is adjusted by changing flow rate of the heating or cooling medium.

* * * * *

UNITED STATES PATENT AND TRADEMARK OFFICE
CERTIFICATE OF CORRECTION

PATENT NO. : 6,831,744 B2
DATED : December 14, 2004
INVENTOR(S) : Fumitaro Masaki et al.

It is certified that error appears in the above-identified patent and that said Letters Patent is hereby corrected as shown below:

Column 2,
Line 27, "th" should read -- the --.
Line 32, "inter" should read -- inert --.

Column 3,
Line 19, "long" should read -- along --.

Column 6,
Line 63, "minor" should read -- mirror --.

Column 7,
Line 1, "systems," should read -- systems, --.
Line 2, "the" should read -- of the --.

Column 12,
Line 60, "such a" should read -- such as --.

Column 15,
Line 10, "a" should be deleted.

Column 16,
Line 6, "controlling;" should read -- controlling -- and the right margin should be closed-up --

Column 17,
Line 11, "apparatus: a" should read -- apparatus: -- and "a light source which" should be on the next line beginning a new paragraph.

UNITED STATES PATENT AND TRADEMARK OFFICE
CERTIFICATE OF CORRECTION

PATENT NO. : 6,831,744 B2
DATED : December 14, 2004
INVENTOR(S) : Fumitaro Masaki et al.

It is certified that error appears in the above-identified patent and that said Letters Patent is hereby corrected as shown below:

<u>Column 18,</u>
Line 53, "flow" should read -- the flow --.

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

PATENT NO.     : 6,831,744 B2
DATED          : December 14, 2004
INVENTOR(S)    : Fumitaro Masaki et al.

It is certified that error appears in the above-identified patent and that said Letters Patent is hereby corrected as shown below:

Column 2,
Line 27, "th" should read -- the --.
Line 32, "inter" should read -- inert --.

Column 3,
Line 19, "long" should read -- along --.

Column 6,
Line 63, "minor" should read -- mirror --.

Column 7,
Line 1, "systems," should read -- system, --.
Line 2, "the" should read -- of the --.

Column 12,
Line 60, "such a" should read -- such as --.

Column 15,
Line 10, "a" should be deleted.

Column 16,
Line 6, "controlling;" should read -- controlling -- and the right margin should be closed-up.

Column 17,
Line 11, "apparatus: a" should read -- apparatus: -- and "a light source which" should be on the next line beginning a new paragraph.

UNITED STATES PATENT AND TRADEMARK OFFICE
CERTIFICATE OF CORRECTION

PATENT NO. : 6,831,744 B2
DATED : December 14, 2004
INVENTOR(S) : Fumitaro Masaki et al.

It is certified that error appears in the above-identified patent and that said Letters Patent is hereby corrected as shown below:

<u>Column 18,</u>
Line 53, "flow" should read -- the flow --. .

This certificate supersedes Certificate of Correction issued April 26, 2005.

Signed and Sealed this

Twenty-eighth Day of March, 2006

JON W. DUDAS
*Director of the United States Patent and Trademark Office*